US011917312B2

(12) United States Patent
Okada et al.

(10) Patent No.: US 11,917,312 B2
(45) Date of Patent: Feb. 27, 2024

(54) SOLID-STATE IMAGING APPARATUS

(71) Applicant: Sony Semiconductor Solutions Corporation, Kanagawa (JP)

(72) Inventors: Chihiro Okada, Tokyo (JP); Luonghung Asakura, Kanagawa (JP); Kengo Iseki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 139 days.

(21) Appl. No.: 17/769,004

(22) PCT Filed: Sep. 30, 2020

(86) PCT No.: PCT/JP2020/037335
§ 371 (c)(1),
(2) Date: Apr. 14, 2022

(87) PCT Pub. No.: WO2021/085025
PCT Pub. Date: May 6, 2021

(65) Prior Publication Data
US 2023/0283922 A1 Sep. 7, 2023

(30) Foreign Application Priority Data
Nov. 1, 2019 (JP) .................. 2019-200246

(51) Int. Cl.
*H04N 25/709* (2023.01)
*H04N 25/772* (2023.01)
(52) U.S. Cl.
CPC ......... *H04N 25/709* (2023.01); *H04N 25/772* (2023.01)

(58) Field of Classification Search
None
See application file for complete search history.

(56) References Cited

U.S. PATENT DOCUMENTS

2018/0227549 A1* 8/2018 Cai .................. H01L 27/14636

FOREIGN PATENT DOCUMENTS

| JP | 2012-54876 A | 3/2012 |
| JP | 2017-183659 A | 10/2017 |
| JP | 2019-68405 A | 4/2019 |

OTHER PUBLICATIONS

International Search Report (PCT/ISA/210), International Application No. PCT/JP2020/037335, dated Dec. 15, 2020.

* cited by examiner

*Primary Examiner* — Mark T Monk
(74) *Attorney, Agent, or Firm* — Michael Best & Friedrich LLP

(57) ABSTRACT

Solid-state imaging apparatuses are disclosed. In one example, an apparatus includes a first substrate and a second substrate. The first substrate includes a pixel array that is arrayed in columns and rows. The second substrate is stacked on the first substrate, and includes first and second analog circuits that overlap with the pixel array in a third direction intersecting the column and row directions. A pixel divider section divides pixels in the array into a first area and a second area. The first and second analog circuits respectively connect to pixels in the first and second areas, and are adjacent to each other with a circuit divider section interposed therebetween, the circuit divider section being located with an overlap with the pixel divider section in the third direction.

20 Claims, 26 Drawing Sheets

SOLID-STATE IMAGING APPARATUS

TECHNICAL FIELD

The present disclosure relates to a solid-state imaging apparatus.

BACKGROUND ART

A conventional sensor, such as a CMOS (Complementary Metal-Oxide Semiconductor) device, including a pixel array where pixels are arrayed obtains signals in sequence from predetermined devices, which disadvantageously lowers a frame rate. A possible configuration for enhancing the frame rate includes a pixel array divided into a plurality of areas with a signal line provided for each of the divided areas, and an analog circuit and a logic circuit that receive signals. Such a configuration, which is less compatible with another circuit and likely to be complicated, is unsuitable to minimization in pixel size and multi-pixelation.

CITATION LIST

Patent Literature

[PTL 1]
Japanese Patent Laid-Open No. 2012-054876

SUMMARY

Technical Problem

In order to avoid the above, it is conceivable that a pixel array is divided into simple areas. Simple division causes plural pixels that are adjacent to each other in the pixel array but are to be processed by different analog circuits, that is, pixels adjacent to each other with a boundary between areas interposed therebetween, to propagate through signal lines different in timing of signal processing. Due to the timing of signal processing being different, the pixels adjacent to each other with the boundary interposed therebetween are likely to be significantly different in timing of light reception as compared with other pixels adjacent to each other. This would cause rolling shutter deformation at the boundary between the areas.

The present disclosure provides a solid-state imaging apparatus which includes a plurality of areas in a pixel array and in which occurrence of deformation is reduced.

Solution to Problem

According to an embodiment, a solid-state imaging apparatus includes a first substrate and a second substrate. The first substrate includes a pixel array in which a plurality of pixels configured to output analog signals by photoelectric conversion is two-dimensionally arrayed in columns along a first direction and rows along a second direction intersecting the first direction. The second substrate is stacked on the first substrate and includes an analog circuit that is located with an overlap with the pixel array in a third direction intersecting the first direction and the second direction and processes the analog signals outputted from the pixels. The pixel array is divided by a pixel divider section along the second direction into a first area and a second area each including continuous ones of the pixels. The analog circuit is divided into a first analog circuit and a second analog circuit that are connected to the pixels belonging to the first area and the pixels belonging to the second area, the first analog circuit and the second analog circuit being adjacent to each other with a circuit divider section interposed therebetween, the circuit divider section being located with an overlap with the pixel divider section in the third direction.

The pixel array may include a plurality of first signal lines that is arranged along the first direction and selects, from among the rows having the pixels continuous in the second direction, one or more of the rows in the first direction, and the analog signals outputted from the pixels selected by the first signal lines may be processed by the analog circuit. By virtue of the first signal lines, the pixels can be specified in units of a row.

The pixel array may include a plurality of second signal lines that is arranged along the second direction and selects, from among the columns having the pixels continuous in the first direction, one or more of the columns in the second direction, the analog signals outputted from the pixels selected by the first signal lines may be transmitted through the second signal lines and processed by the analog circuit, the second signal lines may be electrically separated at the pixel divider section. The second signal lines are each kept in a current-carried state on an area-by-area basis in the pixel array while not being connected to the different areas, which makes it possible to shorten a route thereof.

The pixel divider section and the circuit divider section may be located near a middle of the pixel array in the first direction.

The solid-state imaging apparatus may include a connection section configured to connect the pixels and the analog circuit in the third direction at the pixel divider section and the circuit divider section. Thus, the second signal lines may be separated near the middle of the pixel array, and the first substrate and the second substrate may be connected to each other in the vicinity of the separation.

The connection section may include a first connection section connected to the second signal lines and configured to connect the pixels belonging to the first area and the first analog circuit through the second signal lines, and a second connection section connected to the second signal lines and configured to connect the pixels belonging to the second area and the second analog circuit through the second signal lines. The analog circuit of the second substrate may also be divided as the pixel array.

The solid-state imaging apparatus may include a first switch configured to switch a connection state between the first connection section and the second connection section. By virtue of the first switch being provided in the second substrate, it is possible to maintain comparable electric potentials of floating diffusion of the first area and the second area in the pixel array.

On the basis of a timing of the analog signals being outputted to the analog circuit through the first connection section or the second connection section, the first switch may switch the connection state between the first connection section and the second connection section.

A plurality of the first connection sections, a plurality of the second connection sections, and a plurality of the first switches may be provided along the second direction, and the plurality of first switches may operate in a synchronous manner.

A plurality of the first connection sections and a plurality of the second connection sections may be provided along the second direction, and the solid-state imaging apparatus may include a second switch configured to switch a connection state between the plurality of first connection sections and a third switch configured to switch a connection state between the plurality of second connection sections. By virtue of the second switch, comparable electric potentials in a row direction can be maintained.

On the basis of a timing of the analog signals being outputted to the analog circuit through the first connection sections or the second connection sections, the second switch may switch the connection state between the first connection sections, and the third switch may switch the connection state between the second connection sections.

The second switch and the third switch may operate in a synchronous manner.

A plurality of the second switches and a plurality of the third switches may be provided along the second direction, and the plurality of second switches and the plurality of third switches may operate in a synchronous manner.

The solid-state imaging apparatus may include a first voltage source configured to apply a predetermined voltage to the plurality of first connection sections connected through the second switch and a fourth switch configured to switch a connection state between the first voltage source and the plurality of first connection sections, and the second switch and the fourth switch may operate in a synchronous manner. Such a control makes it possible to raise an electric potential of floating diffusion to a predetermined electric potential.

The solid-state imaging apparatus may include a second voltage source configured to apply a predetermined voltage to the plurality of second connection sections connected through the third switch and a fifth switch configured to switch a connection state between the second voltage source and the plurality of second connection sections, and the third switch and the fifth switch may operate in a synchronous manner. Further, all the switches may operate in a synchronous manner. The synchronization may be performed at a timing based on a timing of reset of the pixels or a timing of output of the analog signals from the pixels.

The first connection section and the second connection section may each be at least as many as the number of the pixels existing in the rows.

The first connection section and the second connection section may each be at least as many as a product of the number of the pixels existing in the rows and a predetermined number. By virtue of the connection sections being provided as above, it is possible to transmit signals outputted from the pixels belonging to the same row to the second substrate in parallel.

The connection section may be in the form of a micro bump, a micro pad, or a via hole.

The first analog circuit and the second analog circuit may process the analog signals from the different pixels belonging to one or more of the rows along the second direction at the same timing.

The first analog circuit and the second analog circuit may change the number of the analog signals to be processed at the same timing, according to predetermined conditions.

The second substrate may convert the analog signals to digital signals, and the solid-state imaging apparatus may include a logic circuit configured to process the digital signals.

The logic circuit may be located with the analog circuit sandwiched thereby in the first direction.

The logic circuit may include a first logic circuit configured to process the digital signals outputted from the first analog circuit and a second logic circuit configured to process the digital signals outputted from the second analog circuit.

The solid-state imaging apparatus may include a plurality of the pixel divider sections and a plurality of the circuit divider sections, and the pixel array divided into a plurality of areas and the analog circuit corresponding to each of the areas.

The second substrate may include a signal processing circuit, an image processing circuit, a storage section, a selector, and an interface. The signal processing circuit performs signal processing of the digital signals. The image processing circuit performs image processing of the digital signals, the digital signals including image information. The storage section stores data freely selected from among the digital signals, data outputted from the signal processing circuit, and data outputted from the image processing circuit. The selector freely selects at least one of the data outputted from the signal processing circuit, the data outputted from the image processing circuit, or the data stored in the storage section. The interface externally outputs data selected by the selector or a signal or externally receives input of data or a signal.

DESCRIPTION OF EMBODIMENTS

Description will be made below on solid-state imaging apparatuses according to several embodiments with reference to the drawings.

First Embodiment

Figure 1:
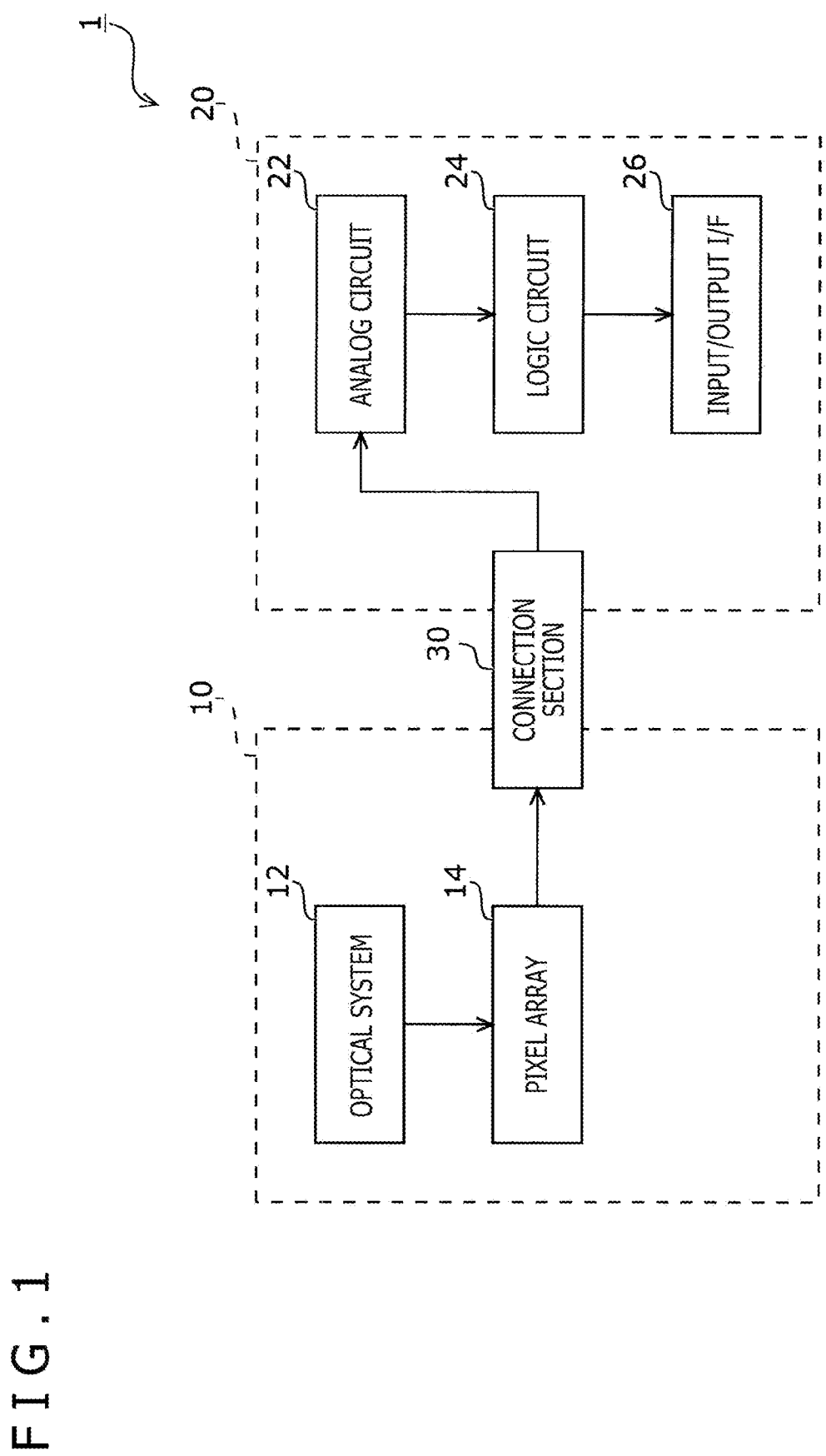
FIG. 1 is a block diagram of a solid-state imaging apparatus according to an embodiment.

FIG. 1 is a block diagram illustrating a function of a solid-state imaging apparatus 1 according to an embodiment. The solid-state imaging apparatus 1 includes, for example, a first substrate 10 and a second substrate 20. The first substrate 10 includes an optical system 12 and a pixel array 14. The second substrate 20 includes an analog circuit 22, a logic circuit 24, and an input/output interface (hereinafter, input/output I/F) 26.

The optical system 12 is a system that corrects a light path, an aberration, and the like in such a manner that the pixel array 14 detects light. The optical system 12, which includes, for example, a lens (including a virtual lens or the like), is installed such that light is appropriately received by the pixel array 14.

The pixel array 14 includes a plurality of pixels that performs photoelectric conversion of received light and outputs analog signals. The analog signal outputted from each of the pixels belonging to the pixel array 14 is transmitted to the second substrate 20 through a connection section 30.

The analog circuit 22 is a circuit that processes the analog signal outputted from each of the pixels of the pixel array 14. The analog circuit 22 may include, for example, an ADC (Analog to Digital Converter) that converts the analog signal to image data, or a digital signal. The analog circuit 22 outputs digital image data converted from the analog signal, to the logic circuit 24.

The analog circuit 22 may further include, for example, a DAC (Digital to Analog Converter) that generates a digital signal that is to be used for analog-digital conversion, a comparator that compares a voltage outputted from the DAC and a voltage of an analog signal, a counter that counts an output from the comparator, and an amplifier that amplifies an output from the counter.

The logic circuit 24, which includes a circuit that processes a variety of obtained digital signals, applies appropriate signal processing to the digital signal outputted from the analog circuit 22. The logic circuit 24, which is, for example, a digital circuit, may include a signal processing circuit and an image processing circuit. The image processing circuit may include, for example, a circuit that performs motion detection or the like, a circuit that performs a process of a neural network, and the like. The image processing circuit may include a circuit that performs, for example, a variety of filtering processes, a deformation process, and the like.

The input/output I/F 26 is an interface that externally outputs data outputted from the logic circuit 24 and externally receives input of data, a request, or the like, if necessary. The solid-state imaging apparatus 1 may further include a selector that selects data outputted from the logic circuit 24, and the input/output I/F 26 may externally output a signal selected by the selector.

The connection section 30 connects the first substrate 10 and the second substrate 20. In the present embodiment, in particular, the connection is intended to cause the analog signals outputted from the pixels belonging to the pixel array 14 located on the first substrate 10 to be outputted to the analog circuit 22 located on the second substrate 20.

The description hereinabove is made on the components related to a route for propagation of analog signals and digital signals according to the present embodiment. Accordingly, a component necessary for any other control is omitted. The first substrate 10 is appropriately provided with, for example, a wiring line or the like that determines from which one of the pixels of the pixel array 14 an output is to be received. In addition, the second substrate 20 is appropriately provided with a control circuit or the like that is in charge of controlling components of the solid-state imaging apparatus 1. Further, in addition to the above-described connection section 30, the connection between the first substrate 10 and the second substrate 20 may be additionally appropriately provided with, for example, a connection route for outputting a signal to a wiring line that determines which pixel is selected from among the pixels belonging to the pixel array 14.

Thus, an element, a wiring line, and the like for achieving workings and effects of the solid-state imaging apparatus 1 are appropriately provided, although they are not illustrated.

Figure 2:
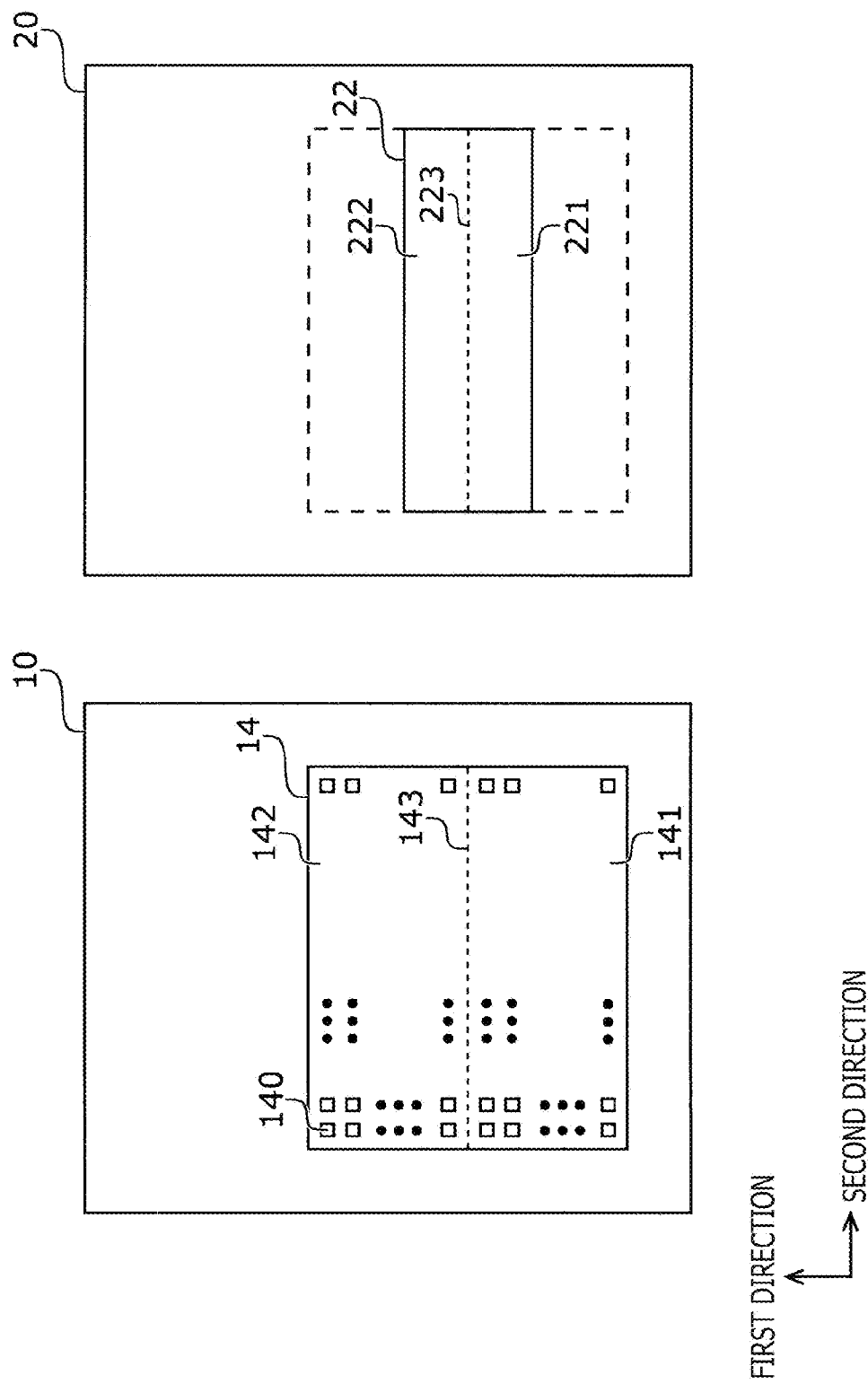
FIG. 2 is a diagram illustrating locations of a pixel array and an analog circuit according to an embodiment.

FIG. 2 is a diagram illustrating an example of locations of the pixel array 14 and the analog circuit 22 according to the present embodiment.

In the first substrate 10, the pixel array 14 includes a plurality of pixels 140 that is two-dimensionally arrayed. The pixels 140 are arrayed along a first direction and a second direction. The pixels 140 each include, for example, a light-receiving device, such as a photo diode (PD), that receives light through a lens, i.e., the optical system 12, and outputs an analog signal on the basis of an intensity of the received light or the like. In the explanation, pixels continuous in the second direction are sometimes referred to as a row and pixels continuous in the first direction as a column. That is, a plurality of rows of the pixels continuous in the second direction is provided in the first direction to form the array; in other words, a plurality of columns of the pixels continuous in the first direction is provided in the second direction to form the array.

The pixel array 14 has a first area 141 and a second area 142. The first area 141 and the second area 142 are divided from each other by a pixel divider section 143. The pixel divider section 143 is provided, for example, near a middle in the first direction across the pixel array 14 along the second direction.

The wording "near the middle" means that, in a case where, for example, the pixel array 14 includes n pixels 140 provided along the first direction, the pixel divider section 143 is provided between the [n/2]-th pixel and the ([n/2]+1)-th pixel. [•] denotes a floor function. Note that this is not limitative and the pixel divider section 143 may be significantly or insignificantly offset to one of upper and lower sides of the pixel array 14 in FIG. 2 instead of being accurately at the middle; however, "near the middle" is taken in the broad sense herein.

In the second substrate 20, the analog circuit 22 is provided, for example, near a middle of an area where the pixel array 14 is present in a stacked state. Broken lines indicate, in the second area 20, a range where the pixel array 14 is provided in the first substrate 10 in the stacked state. The analog circuit 22 is thus provided such that it includes a middle of the range where the pixel array 14 is provided and a neighborhood thereof.

The analog circuit 22 includes a first analog circuit 221 and a second analog circuit 222, and these circuits are provided adjacently to each other with a circuit divider section 223 interposed therebetween. The circuit divider section 223 is located such that, for example, it overlaps the pixel divider section 143 in a third direction with the first substrate 10 and the second substrate 20 being stacked. The location of the circuit divider section 223 does not necessarily exactly overlap the pixel divider section 143 and may be offset therefrom.

The first analog circuit 221 and the second analog circuit 222 each operate as an analog circuit. For example, the first analog circuit 221 and the second analog circuit 222, each of which operates as an ADC, convert analog signals outputted from the pixels 140 to digital signals and output them.

For example, the pixel array 14 and the analog circuit 22 are connected through the connection section 30, which connects the first substrate 10 and the second substrate 20, in the vicinity of the pixel divider section 143 and the circuit divider section 223.

Here, the vicinity means, for example, between the nearest two of the pixels 140 to the pixel divider section 143 in the first direction and the pixel divider section 143. Note that this is not limitative and, for example, the connection section 30 may be, instead of being between the pixels 140 and the pixel divider section 143, located such that it overlaps one or more of the pixels 140 near the middle right thereunder.

Figure 3:
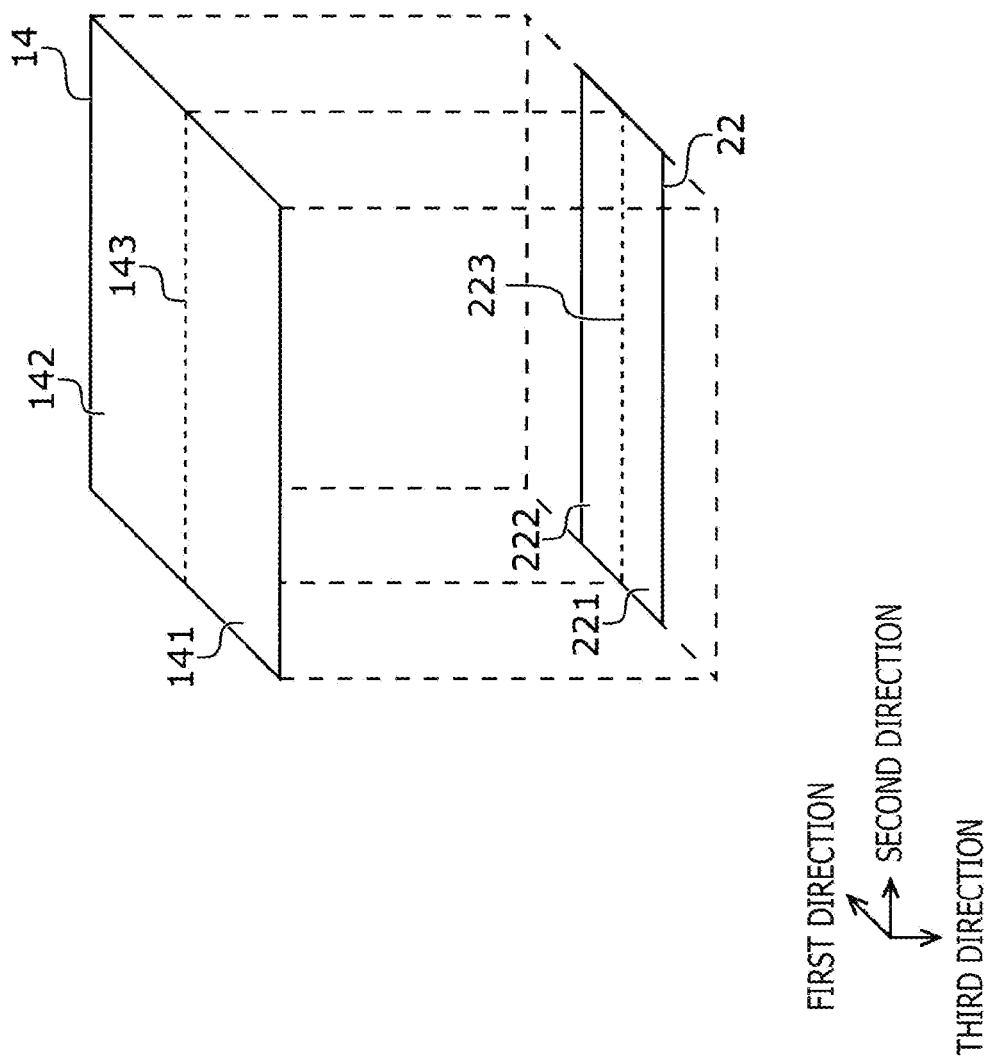
FIG. 3 is a diagram illustrating a stacked state of the pixel array and the analog circuit according to an embodiment.

FIG. 3 is a diagram schematically illustrating positions of the pixel array 14 and the analog circuit 22 with the first substrate 10 and the second substrate 20 being stacked. As illustrated in FIG. 3, the pixel array 14 and the analog circuit 22 are stacked such that the pixel divider section 143 and the circuit divider section 223 overlap each other in the third direction near the middle of the pixel array 14.

The connection section 30 is located to connect the vicinity of the pixel divider section 143 and the vicinity of the circuit divider section 223 to each other between the pixel array 14 and the analog circuit 22 along the third direction. The first analog circuit 221 and the second analog circuit 222 receive analog signals from the pixels 140 connected through the connection section 30 and perform appropriate processing. As described later, for example, a digital circuit (a logic circuit) is provided such that it sandwiches outer sides of the first analog circuit 221 and the second analog circuit 222 in the first direction.

Next, detailed description will be made on connection between the pixel array 14 and the analog circuit 22.

Figure 4:
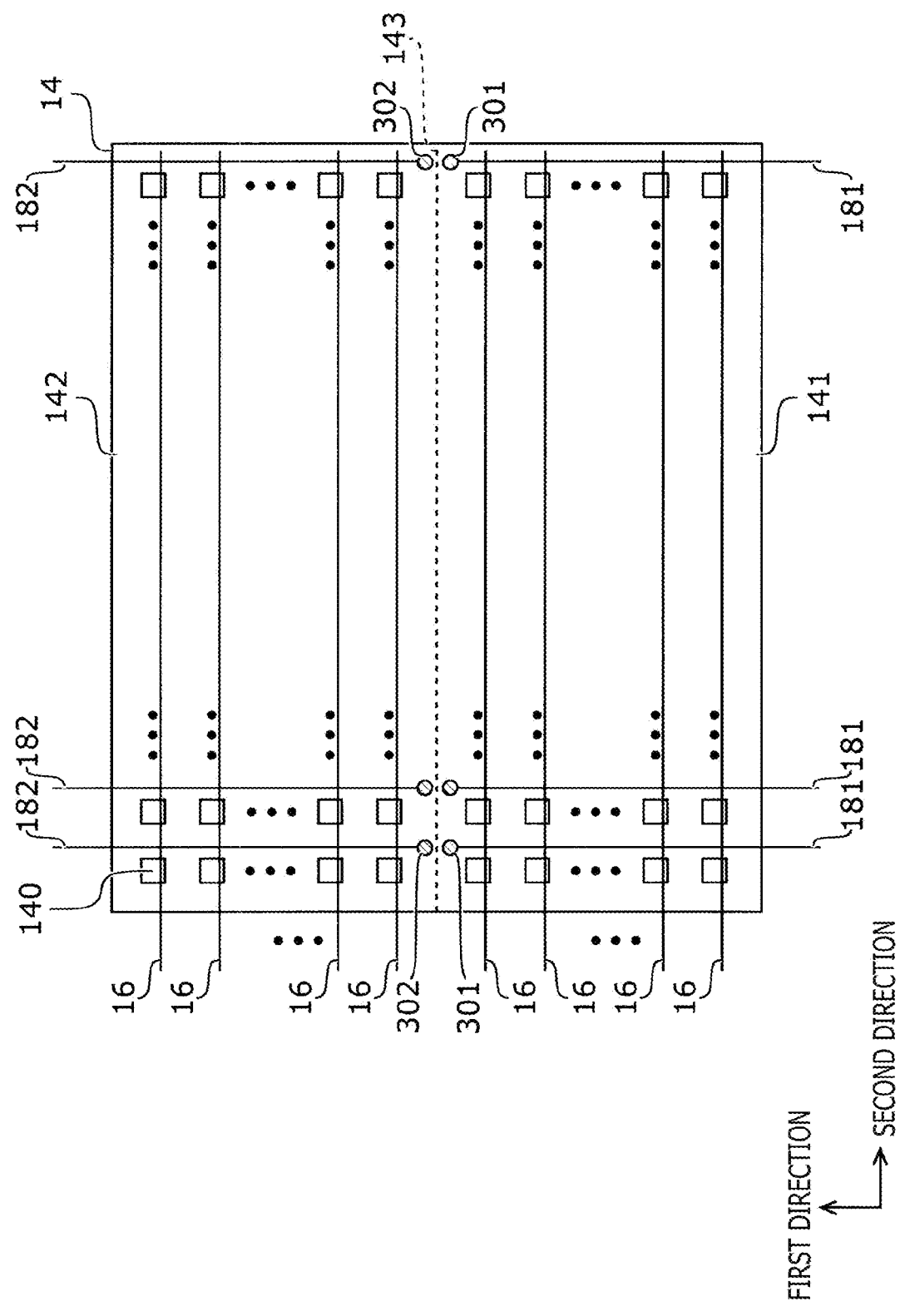
FIG. 4 is a diagram illustrating a wiring example of the pixel array according to an embodiment.

FIG. 4 is a diagram illustrating a wiring example of the pixel array 14 according to the present embodiment. Analog signals outputted from the pixels 140 are to be transmitted to the analog circuit 22 through the wiring lines in FIG. 4. Note that, in FIG. 4, a distance between the pixels above and below the pixel divider section 143 is drawn wider than that between the other pixels; however, this is merely for the convenience of explanation, and the distance may be actually comparable to that between the other pixels.

In the first substrate 10, the pixel array 14 is provided with a plurality of first signal lines 16 and a plurality of second signal lines 181 and 182. The second signal lines 181 and 182 of the same column are electrically separated in the vicinity of the pixel divider section 143. In other words, the second signal lines 181 connected to the pixels 140 belonging to the first area 10 and the second signal lines 182 connected to the pixels 140 belonging to the second area 20 are not directly electrically connected to each other in the first substrate 10.

In addition, the connection section 30 includes a plurality of first connection sections 301 and a plurality of second connection sections 302 in the vicinity of the pixel divider section 143, and the pixels 140 are connected to the analog circuit 22 of the second substrate 20 through the second signal lines 181 and 182 and the connection sections. More specifically, the pixels 140 belonging to the first area 141 are connected to the analog circuit 22 through the second signal lines 181 and the first connection sections 301, whereas the pixels 140 belonging to the second area 142 are connected to the analog circuit 22 through the second signal lines 182 and the second connection sections 302.

The first signal lines 16 are wiring lines for selecting which one of rows of the pixels 140 in the pixel array 14 analog signals outputted from are to be processed. The first signal lines 16, each of which is connected to a row selection circuit, for example, at an end portion opposite the connection to the pixels 140, select the row from which signals are to be outputted to the analog circuit 2, according to a signal from the row selection circuit.

The pixels 140 in units of a row selected through the first signal lines 16 are each transmitted to the first connection section 301 or the second connection section 302 through corresponding one of the second signal lines 181 and 182. The first connection section 301 or the second connection section 302 then outputs the analog signal outputted from the pixel 140 to the analog circuit 22, in which processing of the analog signal is performed.

In the pixel array 14, the processing of analog signals outputted from the pixels 140 is performed, for example, in sequence from a lower row in FIG. 4. For example, processing is first performed for the pixels 140 belonging to the lowermost row in FIG. 4. Respective analog signals outputted from the pixels 140 are subjected to signal processing in parallel in the analog circuit 22. Next, a row immediately above, that is, a second row from the bottom, is likewise subjected to the processing. This processing is performed by, for example, selecting the rows in sequence from the bottom from the row selection circuit, according to a row-direction synchronization signal.

The same applies to the two rows with the pixel divider section 143 interposed therebetween; when processing for the row immediately below the pixel divider section 143 in FIG. 4 is completed, processing for the row immediately above the pixel divider section 1 is performed. In this case, signals from the pixels 140 belonging to the area 141 are transmitted to the analog circuit 22 through the second signal lines 181 and the first connection sections 301, whereas signals from the pixels 140 belonging to the second area 142 are transmitted to the analog circuit 22 through the second signal lines 182 and the second connection sections 302. Subsequently, scanning is likewise sequentially performed from the lower side toward the upper side of the second area 142 on the basis of the row-direction synchronization signal.

Row selection is carried out by, for example, applying, on the basis of the synchronization signal, a selection signal to one of the first signal lines 16 corresponding to a row selected by the row selection circuit. Signal output sections of the pixels 140 belonging to the selected row and a current-carried state of the second signal lines 181 and 182 are controlled by the selection signal, thereby causing the analog signals to be outputted to the analog circuit 22. The control of the current-carried state is carried out by, for example, a MOSFET (Metal-Oxide-Semiconductor Field-Effect-Transistor) having a gate connected to the first signal line 16 and having a drain and a source (alternatively, a source and a drain) connected to the pixels 140 and the second signal lines 181 and 182, respectively. This is not limitative, and the current-carried state may be achieved by any other technique, for example, by a switch that is to be driven by a signal through the first signal line 16.

As described above, the area of the pixel array 14 provided in the first substrate 10 is divided near the middle, with the analog circuit 22 being located in the stacked second substrate 20 near the middle to overlap, which makes it possible to shorten a transmission route of signals outputted from the pixels 140 in the second signal lines 181 and 182. By virtue of the transmission route being shortened, a load on the second signal lines 181 and 182 can be lowered. As a result, as the solid-state imaging apparatus 1, power reduction and speed-up of analog signal processing can be achieved. By virtue of the processing being continuously applied to the rows across the pixel array 14 as well as the speed-up, rolling shutter deformation can also be reduced.

Second Embodiment

The accuracy of the analog signal processing can be further improved by additionally providing a switch in the second substrate 20 in the above-described embodiment.

Figure 5:
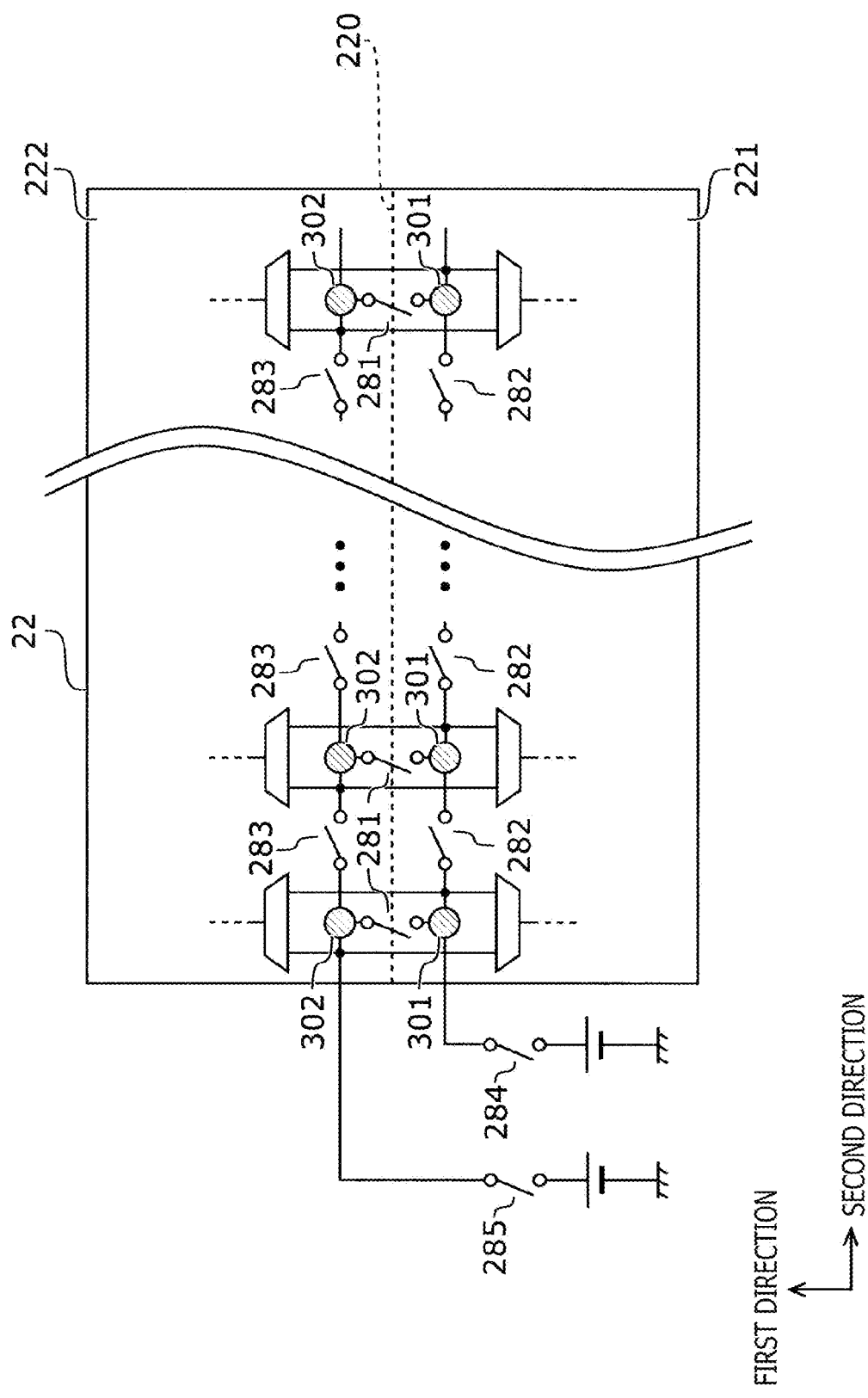
FIG. 5 is a diagram illustrating an outline of the analog circuit according to an embodiment.

FIG. 5 is a diagram schematically illustrating connection in the vicinity of the circuit divider section of the analog circuit 22 according to the present embodiment. Note that an aspect ratio is adjusted in FIG. 5 for the convenience of explanation but an approximate stacking relation and an approximate size relation with the pixel array 14 in FIG. 4 are as in FIG. 3.

The analog circuit 22 includes the first analog circuit 221 and the second analog circuit 222 with the circuit divider section 220 interposed therebetween as described above.

For example, a wiring line to which the first connection sections 301 are connected from the first substrate 10 is located in the first analog circuit 221. For example, a wiring line to which the second connection sections 302 are connected from the first substrate 10 is located in the second analog circuit 222. As illustrated, the connection sections are each connected in the first analog circuit 2221 or the second analog circuit 222 via, for example, a multiplexer (or an analog switch) to perform the processing of a transmitted analog signal. The analog circuit 22 may include a comparison circuit and a counter circuit, which are not illustrated, before the multiplexer, causing a digital signal converted on the basis of an output from the DAC to be outputted to the multiplexer or the like.

In the second substrate 20, first switches 281 are provided between the first connection sections 301 and the second connection sections 302.

The plural first connection sections 301 are connected to each other along the second direction, with second switches 282 being provided between the first connection sections 301. The plural second connection sections 302 are connected to each other along the second direction, with third switches 283 being provided between the second connection sections 302.

The plural first connection sections 301 are connected to a voltage source via a fourth switch 284, for example, at one end of the wiring line connecting them to each other via the second switches 282. The plural second connection sections 302 are connected to a voltage source via a fifth switch 285, for example, at one end of the wiring line connecting them to each other via the third switches 283. The voltage sources may be constant voltage sources. In addition, voltages to be applied by the voltage sources may be the same.

The plural first switches 281 synchronously switch the respective current-carried states between the first connection sections 301 and the second connection sections 302. In other words, the first connection sections 301 are each connected, at a predetermined timing, to the second connection section 302 connected to the second signal line 182 belonging to the same column in the pixel array 14 as the second signal line 181 connected thereto. This connection is synchronously carried out, which causes the second signal line 181 and the second signal line 182 belonging to the same column among the plurality of columns to be connected at the same timing in the second substrate 20. Electric potentials of the first connection section 301 and the second connection section 302 are thus controlled to be the same electric potential at the predetermined timing, and this electric potential is outputted to the first analog circuit 221 and the second analog circuit 222. By virtue of this control, it is possible to equalize electric potentials of spots in the analog circuit 22 where pixels in the same column are to be processed.

The second switches 282 synchronously switch the current-carried states between the first connection sections 301. The third switches 283 synchronously switch the current-carried states between the second connection sections 302. Further, the second switches 282 and the third switches 283 are synchronized to switch the current-carried states. In other words, the plurality of first connection sections 301 and the plurality of second connection sections 302 are connected to each other at the predetermined timing and controlled to be the same electric potential. By virtue of this control, it is possible to equalize electric potentials of floating diffusion of the pixels 140.

Further, the second switches 282 and the third switches 283 may be synchronized to control the fourth switch 284 and the fifth switch 285. Such a control makes it possible to increase the electric potentials of floating diffusion of the pixels 140 to a predetermined electric potential at a predetermined timing.

Further, the first switches 281, the second switches 282, the third switches 283, the fourth switch 284, and the fifth switch 285 may be switched in a synchronous manner. For example, the switches may be synchronized to cause current to be carried, for example, from a reset period when analog signals are received from the pixels 140 and processing of the analog signals is completed to a next transfer period. Such processing makes it possible to raise the electric potentials of floating diffusion of the pixels 140 to the predetermined electric potential and, further, equalize the electric potentials of the first analog circuit 221 and the second analog circuit 222.

Figure 6:
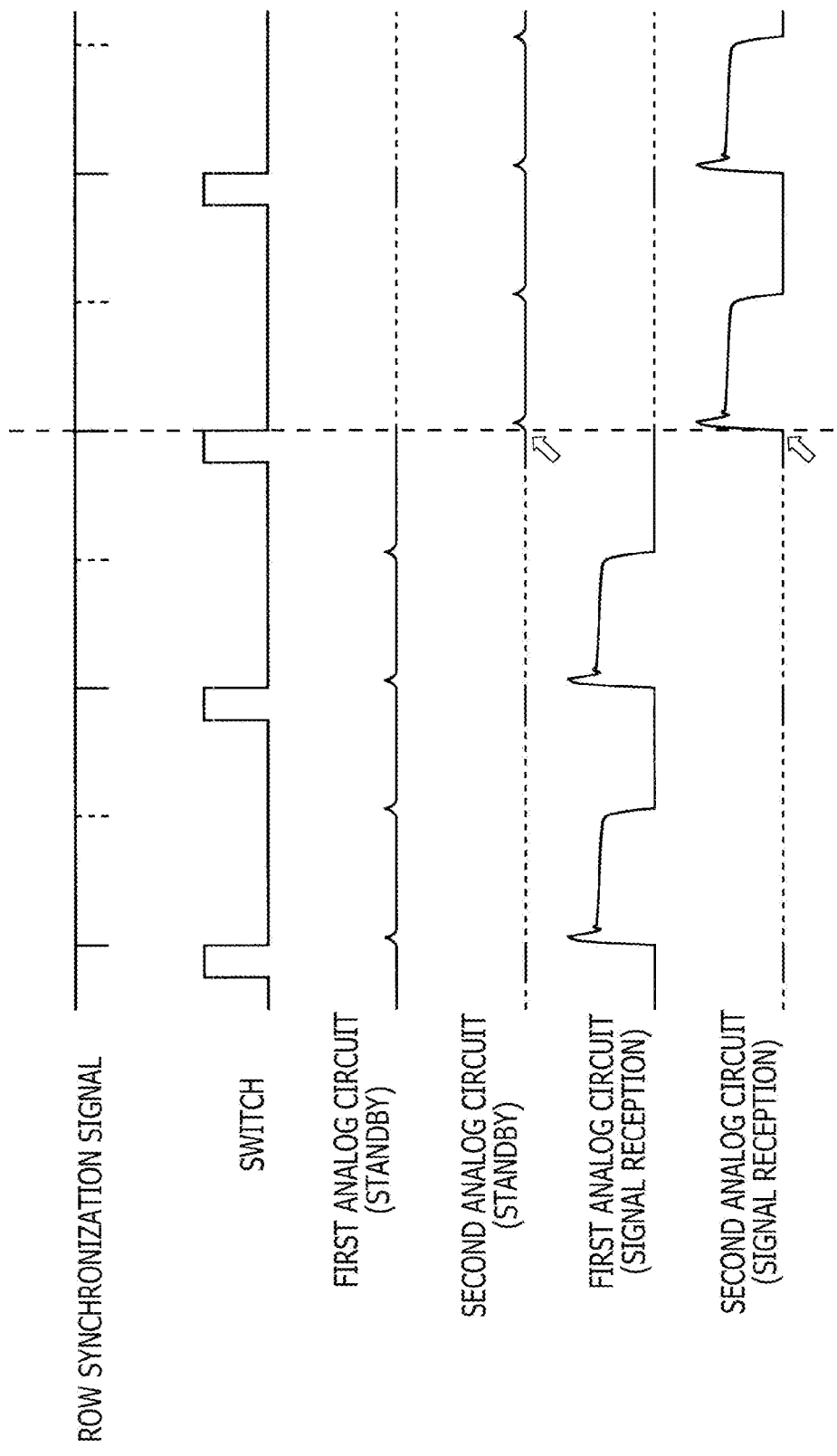
FIG. 6 is a diagram illustrating an electric potential responsive to a control of a switch of a second substrate according to an embodiment.

FIG. 6 illustrates an example of a timing chart of the electric potentials of the first analog circuit 221 and the second analog circuit 222 in a case where control is performed by using the above-described switches provided in the second substrate 20. The uppermost chart is a row synchronization signal outputted from the row selection circuit. The analog signals from the pixels 140 belonging to one row are processed in parallel on the basis of the row synchronization signal. A dotted line indicates a reset signal and, for example, a charge in the circuit is reset at this timing. At a timing indicated by a broken line, a row where the processing is switched from the first analog circuit 221 to the second analog circuit 222 is crossed over.

The second chart from the top is a switching example of a switch. The switch is turned on/off on the basis of the synchronization signal. For example, the states of all the switches may be switched according to the synchronization signal as described above, or only the first switches 281, only a combination of the second switches 282 and the third switches 283, and only a combination of the second switches 282, the third switches 283, the fourth switch 284, and the fifth switch 285 are independently switched.

In the present embodiment, for example, the synchronization signal is issued at the timing of completion of scanning of rows. This is merely by way of example and not limitative. For example, it is only necessary for the synchronization signal to be issued between a reset signal and a row synchronization signal. This timing may be written in a register or the like provided in the solid-state imaging apparatus 1. In addition, the synchronization signal, i.e., a period when the switch is turned on, may also be set as desired within a range where the signal processing is to be appropriately performed.

The third and fourth charts from the top are charts each indicating transition of the electric potential in a standby state. The fifth and sixth charts from the top are charts each indicating transition of the electric potential in a state where analog signals are received. The transitions of electric potential indicate, for example, changes in signals at the first connection sections 301 and the second connection sections 302.

In a chart indicating the state of electric potential, a solid line indicates a connected actual electric potential, and a dotted line indicates that the state of electric potential is unknown due to the circuit being opened.

Figure 7:
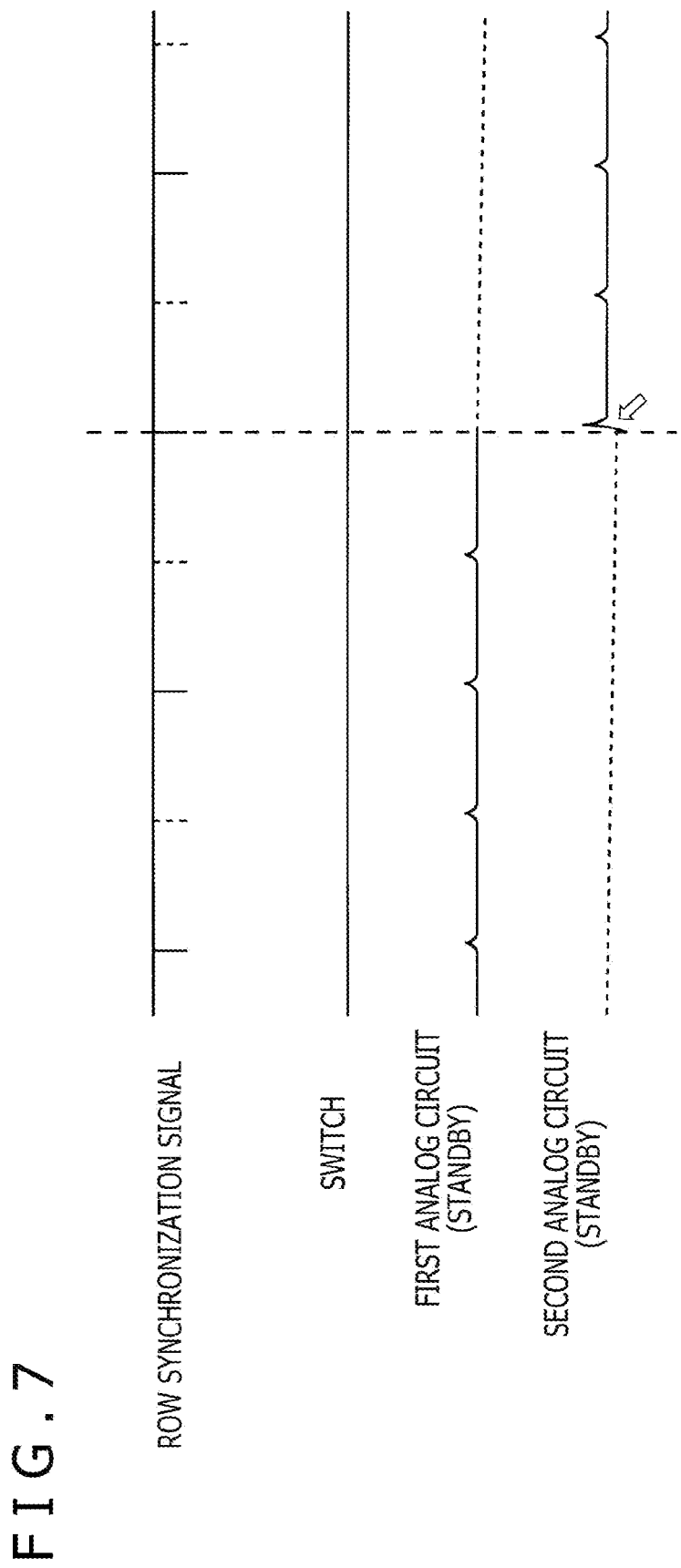
FIG. 7 is a diagram illustrating an electric potential responsive to a control of the switch of the second substrate according to a comparative example.

In contrast, FIG. 7 is a diagram illustrating a case where no switch control is performed, that is, all the switches are off, as a comparative example. Referring to FIG. 6 and FIG. 7, workings of the switches will be described.

In a case where none of the first switches 281 is present, the processing for the first area 141 and the processing for the second area 142 are continuously performed in the first analog circuit 221 and the second analog circuit 222. In this case, a floating state of the second analog circuit 222 has continued for a long time since before a timing of processing the pixels 140 belonging to the rows between which the pixel divider section 143 is present as indicated by an arrow in FIG. 7, so that the electric potential is unknown. A discontinuous signal is thus likely to occur due to signal processing being performed from the unknown electric potential. The signal discontinuity likewise occurs not in a standby state but even at the timing of performing signal processing.

Meanwhile, the circuits can be switched at the timing when the electric potential difference between the first analog circuit 221 and the second analog circuit 222 is eliminated by turning on the first switches 281 at the end of the rows in response to the synchronization signal. The switching makes it possible to process analog signals from the pixels 140 with continuity of the electric potentials of the signals maintained as indicated by an arrow in FIG. 6. As a result, it is possible to reduce noise contamination due to the discontinuity, excessive transient response, or an electric potential being measured to be lower than in reality.

The synchronous switching of the second switches 282 and the third switches 283 makes it possible to shorten a floating period, during which the state is unknown, indicated by a dotted line in FIG. 7. For example, in FIG. 7, the processing is to be started from the floating state, in which the electric potential is unknown, at the timing of switching of areas. By virtue of the floating period being hashed as illustrated in FIG. 6, it is possible to obtain stable analog signals from the pixels 140.

Further, the synchronization of the fourth switch 284 and the fifth switch 285 makes it possible to control the floating electric potential to be a predetermined value. As a result, a further stable measurement result can be obtained.

As described above, the continuity is ensured by virtue of the first switches 281 while the electric potential of floating diffusion can be stabilized by virtue of the second switches 282, the third switches 283, the fourth switch 284, and the fifth switch 285, which makes it possible to perform highly accurate processing even in the case where the analog circuit 22 is divided.

Note that, as described above, only the first switches 281 may be switched, or only the second switches 282 to the fifth switch 285 may be switched. Further, the first switches 281 to the fifth switch 285 may all be switched in a synchronous manner. Alternatively, in another example, with the second switches 282 to the fifth switch 285 being on, at a timing thereafter, a control may be performed to cause the first switches 281 to be turned on.

Note that a control may be performed as follows.

For example, at a timing when analog signals from the pixels 140 belonging to the first area 141 are processed, the third switches 283, which connect the second connection sections 302 to each other, may be always connected. By virtue of thus maintaining the connection state, it is possible to maintain comparable floating states in the columns until a timing of transition of the pixels 140 to be processed from the first area 141 to the second area 142.

Further, the fifth switch 285 may be in a connection state. By virtue of the third switches 283 and the fifth switch 285 thus being in the connection state, the floating states in the columns can be held at a predetermined electric potential.

Likewise, at a timing when analog signals from the pixels 140 belonging to the second area 142 are processed, the second switches 282 may be always connected, or the second switches 282 and the fourth switch 284 may be always connected.

Third Embodiment

In the configurations of the above-described embodiments, the pixel divider section 143 and the corresponding circuit divider section 223 are provided one each; however, this is not limitative. In other words, the pixel array 14, the analog circuit 22, and the logic circuit 24 may be divided into a larger number of areas.

Figure 8:
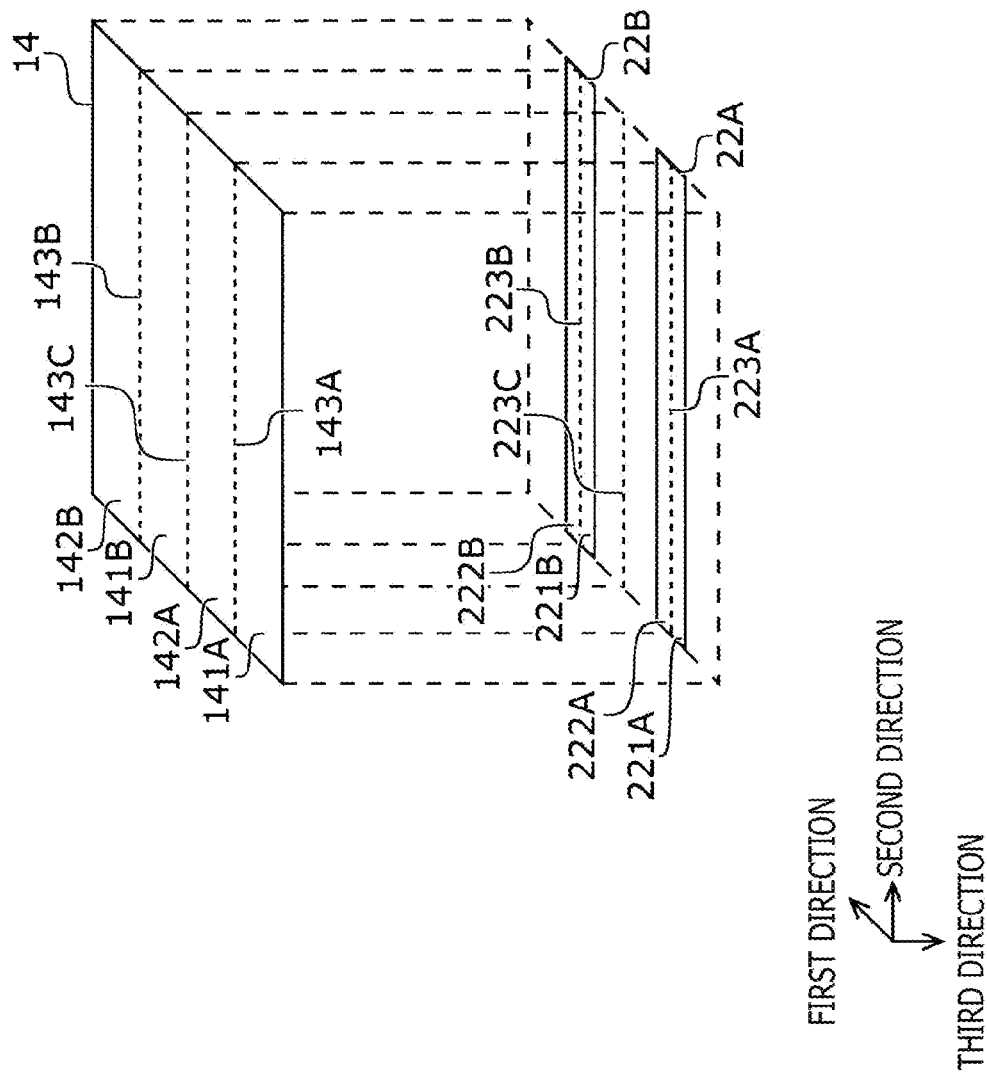
FIG. 8 is a diagram illustrating a stacked state of the pixel array and the analog circuit according to an embodiment.

FIG. 8 is a diagram illustrating a stacked state of the pixel array 14 and the analog circuit 22 according to the present embodiment. The pixel array 14 includes three pixel divider sections 143A, 143B, and 143C, whereas the second substrate 20 corresponding thereto includes at least circuit divider sections 223A and 223B and, further, a circuit divider section 223C. Note that the circuit divider section 223C is not an essential component.

The pixel array 14 is divided into two large areas by the pixel divider section 143C. These areas are divided into a first area 141A and a second area 142A by the pixel divider section 143A and into a first area 141B and a second area 142B by the pixel divider section 143B. The pixel array 14 is thus divided into, for example, four areas.

For the pixels 140 continuous in the second direction, that is, the pixels belonging to the same row, a single first signal line is provided as in the above-described embodiments. Meanwhile, a second signal line connected to the pixels 140 continuous in the first direction and that belong to the areas 141A, 142A, 141B, and 142B is separated between the areas as in the above-described embodiments and outputted to the analog circuit 22 through the respective connection sections. In other words, in the example of FIG. 8, four second signal lines are provided for each column.

Figure 9:
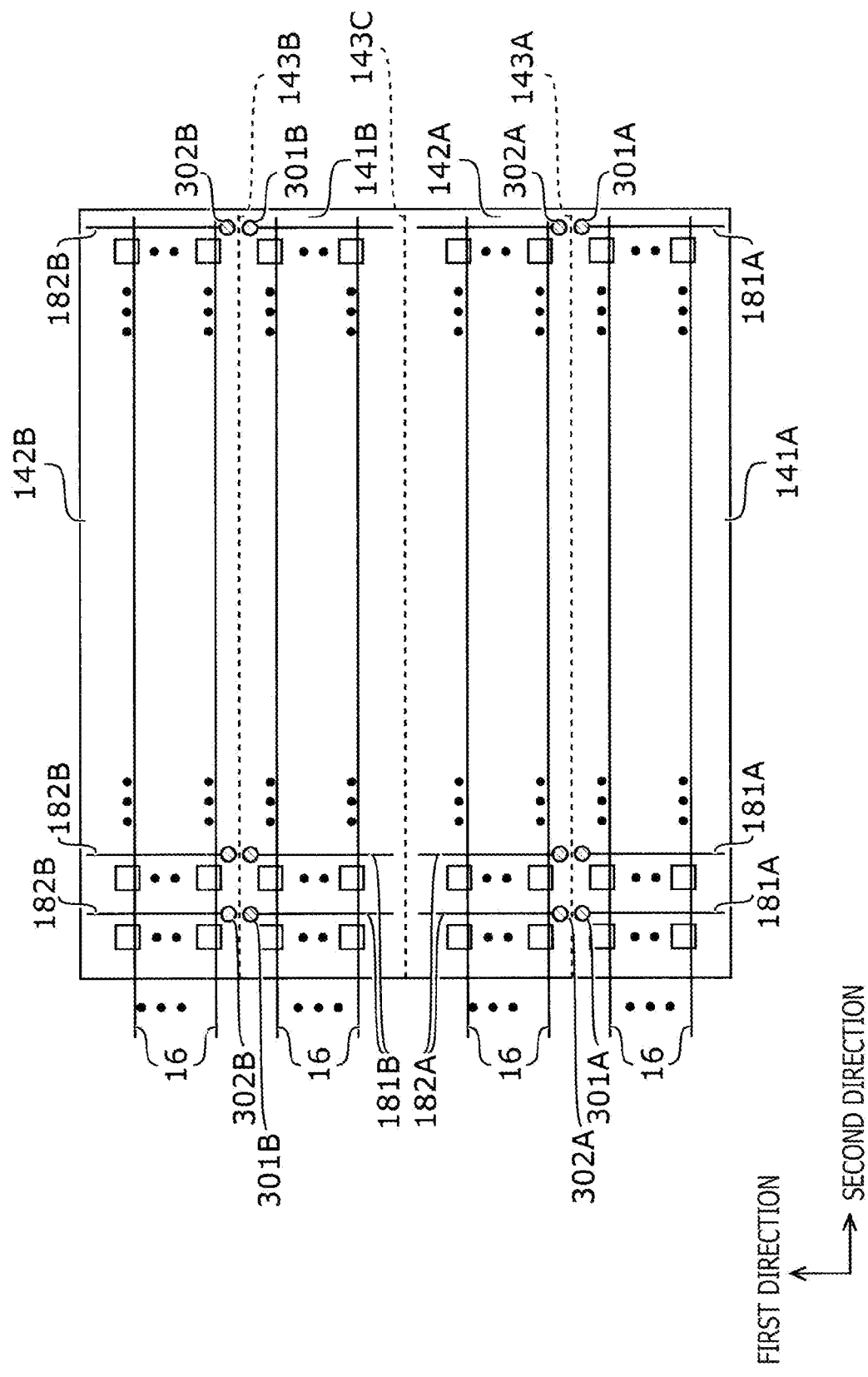
FIG. 9 is a diagram illustrating a wiring example of the pixel array according to an embodiment.

FIG. 9 is a diagram illustrating an outline of the pixel array 14 according to the present embodiment. The pixel array 14 is divided into the areas 141A, 142A, 141B, and 142B by the pixel divider sections 143A, 143B, and 143C. The divided areas are each provided with the first selection lines 16 as many as the rows where the pixels 140 are present for selecting whether or not the pixels 140 belonging to the same rows are to perform output. A distance between the pixels is wider at a spot where the pixel divider section is crossed over as in FIG. 4; however, it is merely for the convenience of explanation and, in fact, the distance may be comparable to a distance between other pixels.

In contrast, the second signal lines are provided such that they are each connected to outputs from the pixels 140 belonging to the same column in each of the areas while being separated between the different areas. For example, plural second signal lines 181A arranged in the area 141A connect the pixels 140 belonging to the respective columns. Meanwhile, the second signal lines 181A are provided such that they are not electrically connected to second signal lines 182A, 181B, and 182B in the other areas 142A, 141B, and 142B.

The signal lines are connected to the second substrate 20 by connection sections. For example, the second signal lines 181A in the first area 141A are connected through first connection sections 301A to an analog circuit 22A. It is the same for the others; the second signal lines 182A in the second area 142A are connected through second connection sections 302A to the analog circuit 22A. In addition, it is the same on an upper side in the figure as on a lower side; the second signal lines 181B in the first area 141B are connected through first connection sections 301B and the second signal lines 182B in the second area 142B are connected through second connection sections 302B to an analog circuit 22B.

The pixel array 14 may be divided into the plurality of areas by the plurality of pixel divider sections 143 as above. As illustrated in FIG. 9, the second signal lines and the connection sections, which are independently provided in each of the areas, are each connected to the analog circuit 22 of the second substrate 20.

Referring back to FIG. 8, description will be made on the second substrate 20. Areas provided with the connection sections 30 in FIG. 9 are provided with respective analog circuits. For example, the second substrate 20 includes the analog circuit 22A and the analog circuit 22B.

The circuit divider sections 223A and 223B are present in the respective analog circuits 22 such that they overlap the pixel divider sections 143A and 143B in the third direction in a stacked state as in the above-described embodiments. The analog circuit 22A is divided into a first analog circuit 221A and a second analog circuit 222A by the circuit divider section 223A, whereas the analog circuit 22B is divided into a first analog circuit 221B and a second analog circuit 222B by the circuit divider section 223B. The configuration of each circuit is comparable to that in FIG. 5, and detailed description thereof is omitted accordingly.

For example, logic circuits may be provided, in the figure, on a lower side of the first analog circuit 221A, between the second analog circuit 222A and the first analog circuit 221B, and on an upper side of the second analog circuit 222B.

The division number of the pixel array 14 can be increased as above. Such an increase in division number makes it possible to further lower a load on the second signal lines, allowing for achieving further speed-up and reduction in power consumption.

Fourth Embodiment

In the above-described embodiments, the single second signal line is provided for one column; however, this is not limitative. For example, a plurality of second signal lines may be provided for the pixels 140 belonging to one column. The plurality of second signal lines may be provided with respective connection sections.

Figure 10:
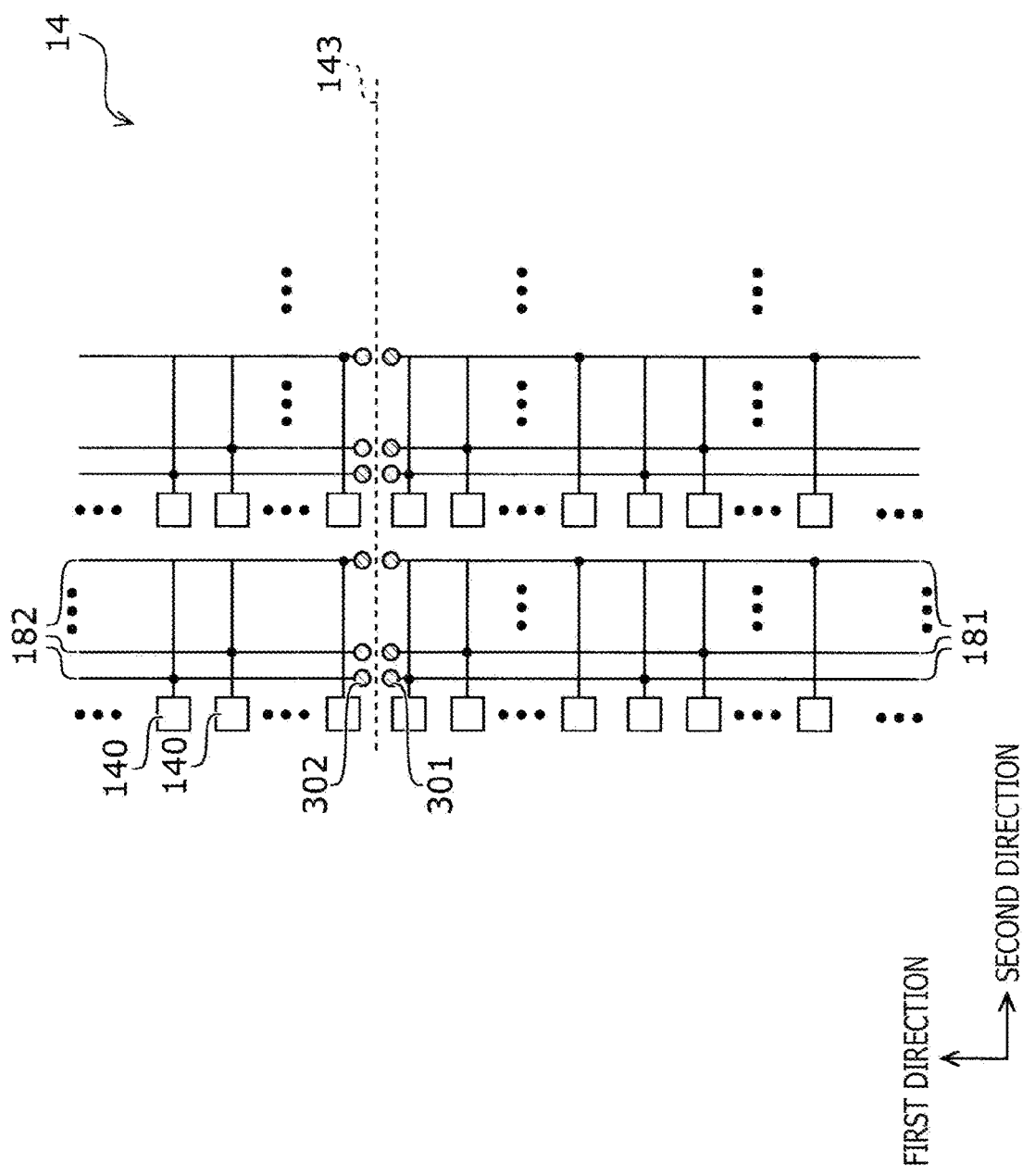
FIG. 10 is a diagram illustrating a wiring example of the pixel array according to an embodiment.

FIG. 10 is a diagram schematically illustrating an outline of the pixel array, the second signal lines, and the connection sections according to the present embodiment. In the figure, pixels, wiring lines, connection sections, and the like are all drawn on a plane; however, this is not limitative. For example, a configuration where pixels are on an upper surface with wiring lines being provided therebelow in the third direction and the wiring lines and connection sections are connected within the first substrate 10 is also acceptable.

The pixel array 14 includes the plurality of pixels 140. The plural second signal lines 181 and 182 are provided such that outputs from the pixels 140 belonging to the same column are each connected thereto. Unlike the above-described embodiments, the plural second signal lines 181 and 182 are provided between columns. Note that the first signal lines, which are omitted from the illustration for the convenience of explanation, are provided as in FIG. 4 and the like.

For example, 12 of the second signal lines 181 and 182 may be provided in each space between the columns of the pixels 140. In this case, analog signals outputted from 12 or less of the pixels 140 along the first direction may be outputted to the analog circuit 22 of the second substrate 20 in parallel. In other words, processing of analog signals can be applied to the pixels 140 belonging to 12 or less of the rows in parallel at the same timing.

The first signal lines, which are not illustrated, specify the 12 or less rows at the same timing. In the figure, a spot where the wiring lines connected from the pixels 140 and the second signal lines are indicated by black dots is an electrically connected spot, whereas a spot with no black spot is a not electrically connected spot. For example, switches are provided at points where the wiring lines from the pixels 140 and the second signal lines intersect, and states of the switches are appropriately switched through the first signal lines, which makes it possible to select the pixels 140 to which the processing of analog signals is to be applied.

Figure 11:
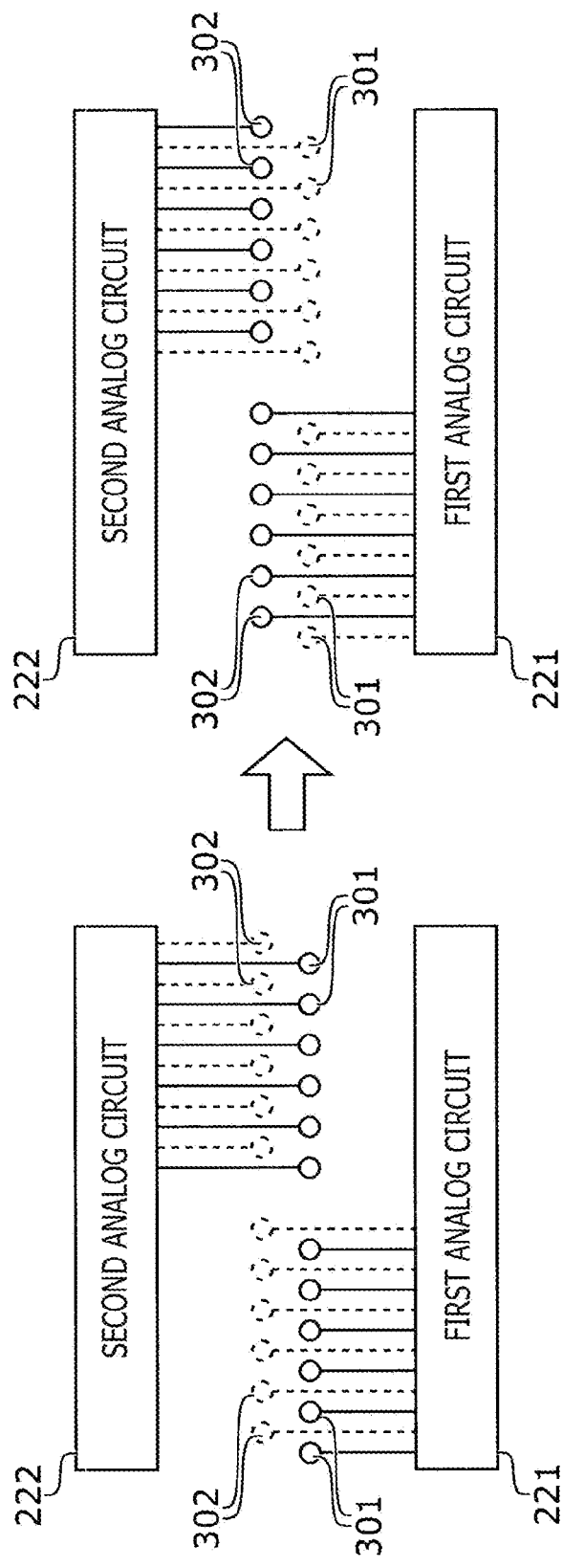
FIG. 11 is a diagram illustrating a wiring example of the analog circuit according to an embodiment.

FIG. 11 is a diagram illustrating, by way of example, wiring lines of an analog circuit with 12 pairs of second signal lines and 12 pairs of connection sections. A left figure illustrates distribution of signals at a timing of processing analog signals from the pixels 140 belonging to the first area 141, and a right figure illustrates distribution of signals at a timing of processing analog signals from the pixels 140 belonging to the second area 142.

In the left figure, the first connection sections 301 are indicated by solid lines, and the second connection sections 302 are indicated by dotted lines. Twelve pairs of connection sections are thus provided from the first substrate 10 to the second substrate 20 for each column. Six pairs of connection sections on the left cause signals that are to be processed by the first analog circuit 221 to be transmitted, whereas six pairs of connection sections on the right cause signals that are to be processed by the second analog circuit 222 to be transmitted. The first switches 281, the second switches 282, and the third switches 283, which are not illustrated, may be provided between the respective connection sections. Further, the fourth switch 284, the fifth switch 285, and a voltage source may be provided.

At a timing when the pixels 140 belonging to the first area 141 are targets for processing, analog signals outputted from the first connection sections 301 are appropriately distributed and outputted to the first analog circuit 221 and the second analog circuit 222 as illustrated in the left figure. Then, the analog circuits perform the analog signal processing in parallel. Signals from the plurality of pixels 140 can thus be outputted to the plurality of analog circuits through a short route.

At a timing of transition of the pixels 140 to which the signal processing is to be applied from those belonging to the first area 141 to those belonging to the second area 142, that is, a timing when the row selection circuit selects the first signal line over the pixel divider section 143, transition occurs as in the right figure. In response to the transition, the second connection sections 302 are distributed and connected to the first analog circuit 221 and the second analog circuit 222, enabling signals from the plurality of pixels 140 to be appropriately processed in parallel in a similar manner as described above.

As described above, the present embodiment enables analog signals outputted from the pixels 140 across a plurality of rows to be appropriately processed in parallel. Even in a case where such processing is performed, a load on the second signal lines can be reduced by providing the analog circuit 22 as in the above-described embodiments and appropriately arranging the signal lines, which makes it possible to achieve speed-up and reduction in power consumption of the analog signal processing.

FIG. 12 to FIG. 15 illustrate a variety of processing methods for, for example, wiring lines enabling processing 12 signals on a column-by-column basis in parallel as described above. Solid lines indicate wiring lines and connection sections that are to be used, and dotted lines indicate wiring lines and connection sections that are not to be used at that timing. In this manner, instead of performing processing of the pixels 140 in 12 rows for one column in parallel, the processing can be performed in a switching manner on the basis of an image desired to be obtained or a setting such as a low-power mode.

Figure 12:
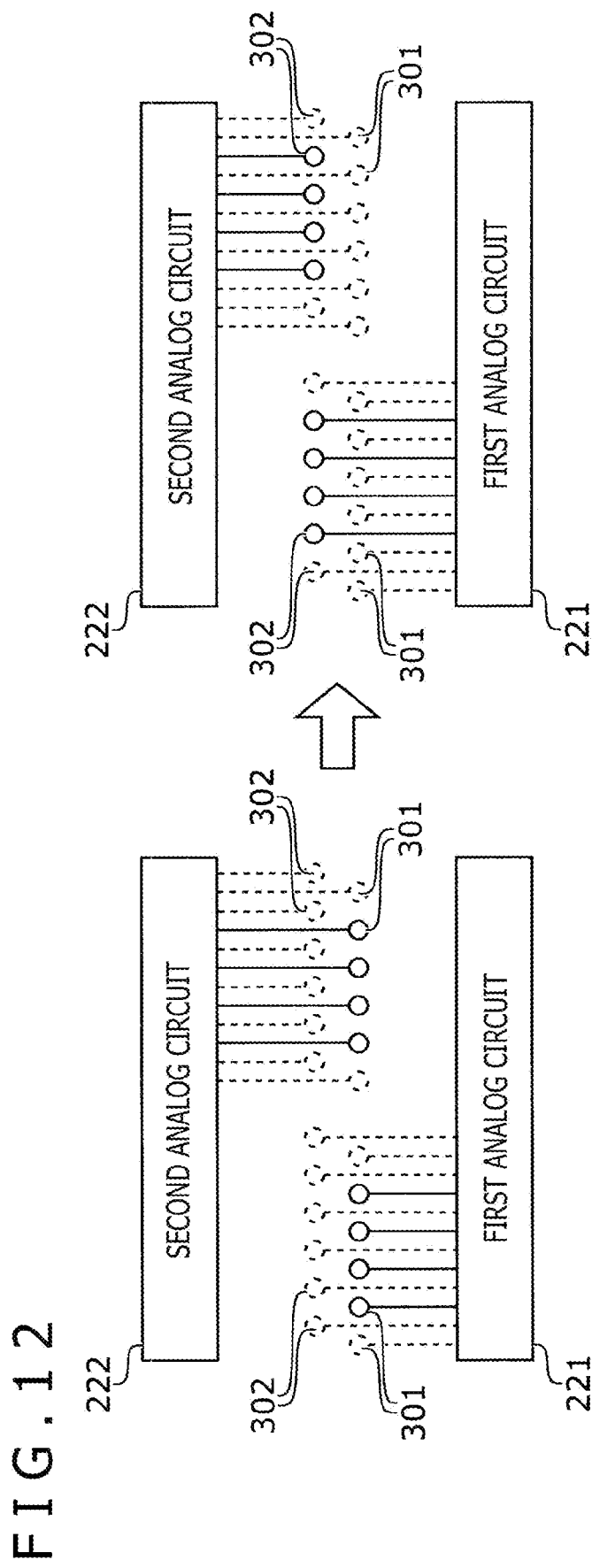
FIG. 12 is a diagram illustrating a wiring example of the analog circuit according to an embodiment.

FIG. 12 is a diagram illustrating an example of processing, for example, the pixels 140 in eight rows for one column in parallel. For example, among six pairs of the first connection sections 301 and the second connection sections 302, the connection sections at a middle portion may be used to form wiring lines. In this case, in FIG. 10, among the twelve second signal lines, two at both ends and two at the middle are not to be used. By virtue of such cooperation of the wiring lines of the first substrate 10 and the second substrate 20, the processing can be applied to the pixels 140 in eight rows for one column in parallel.

Figure 13:
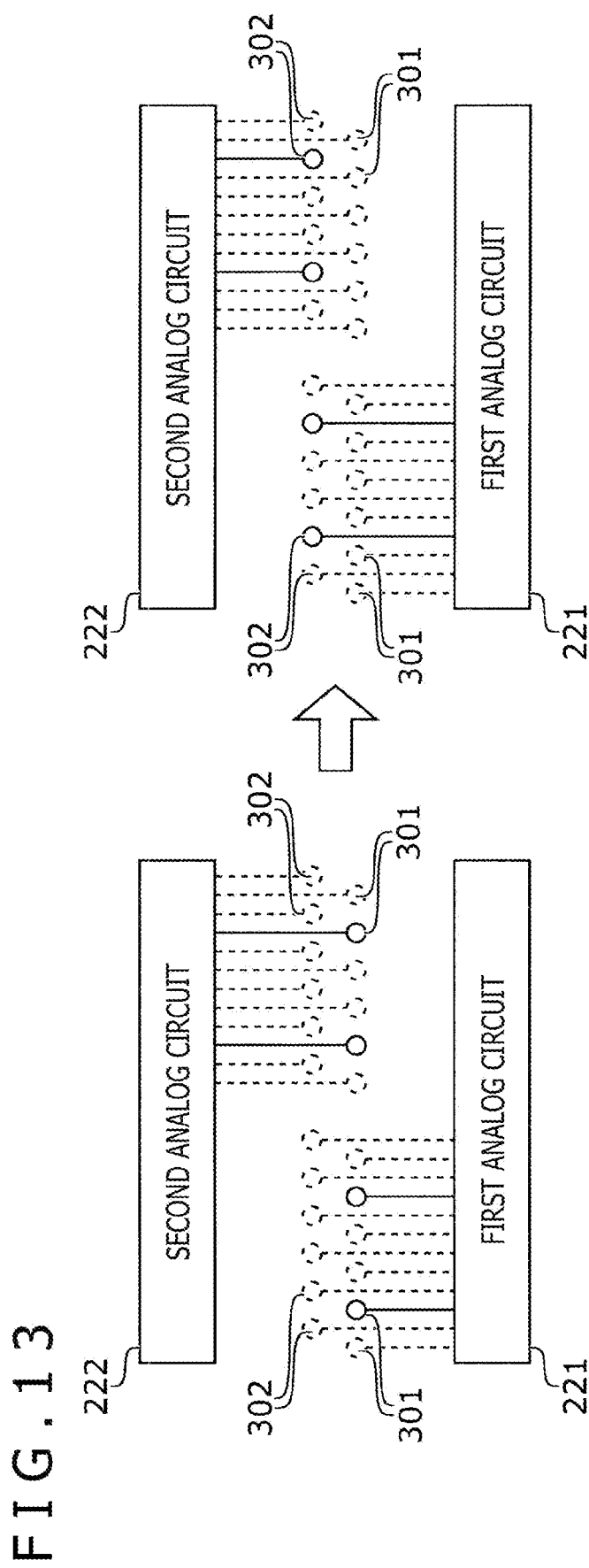
FIG. 13 is a diagram illustrating a wiring example of the analog circuit according to an embodiment.

FIG. 13 is a diagram illustrating an example of processing, for example, the pixels 140 in four rows for one column in parallel. Four of the connection sections and four of the wiring lines may be used to process four of the pixels in parallel in this manner.

Figure 14:
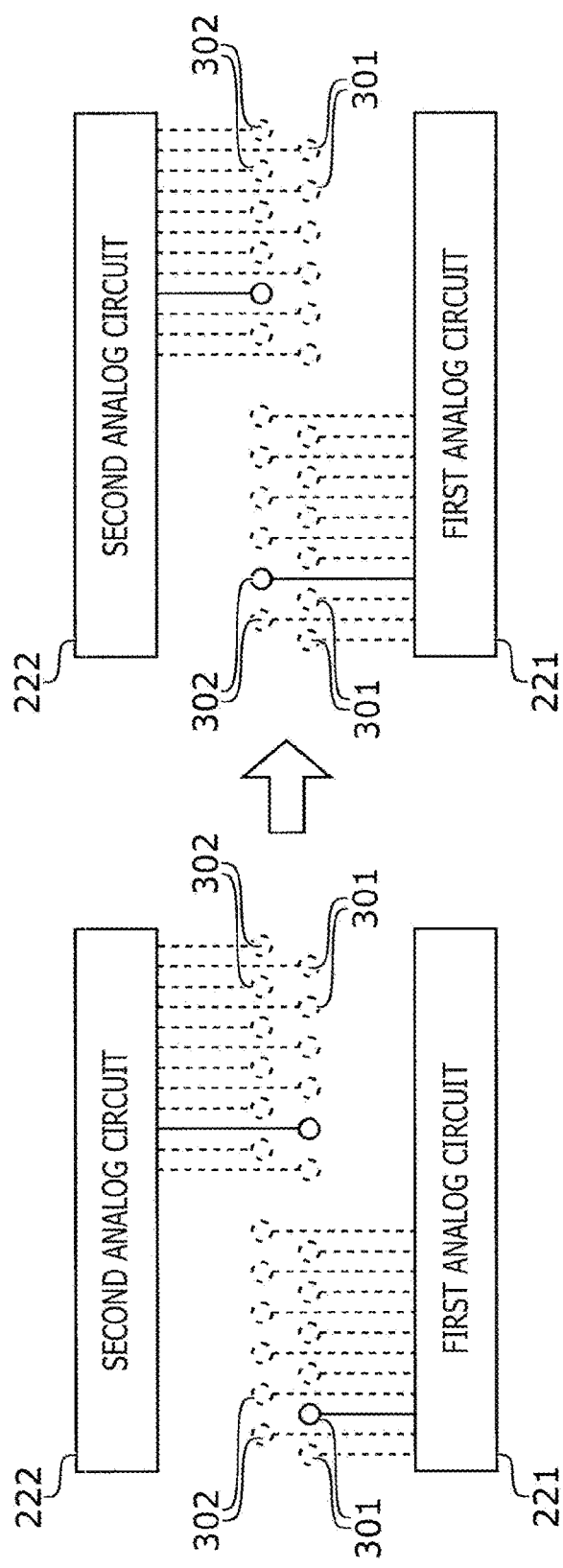
FIG. 14 is a diagram illustrating a wiring example of the analog circuit according to an embodiment.

FIG. 14 is a diagram illustrating an example of processing, for example, the pixels 140 in two rows for one column in parallel. Two of the connection sections and two of the wiring lines may be used to process two of the pixels in parallel in this manner.

Figure 15:
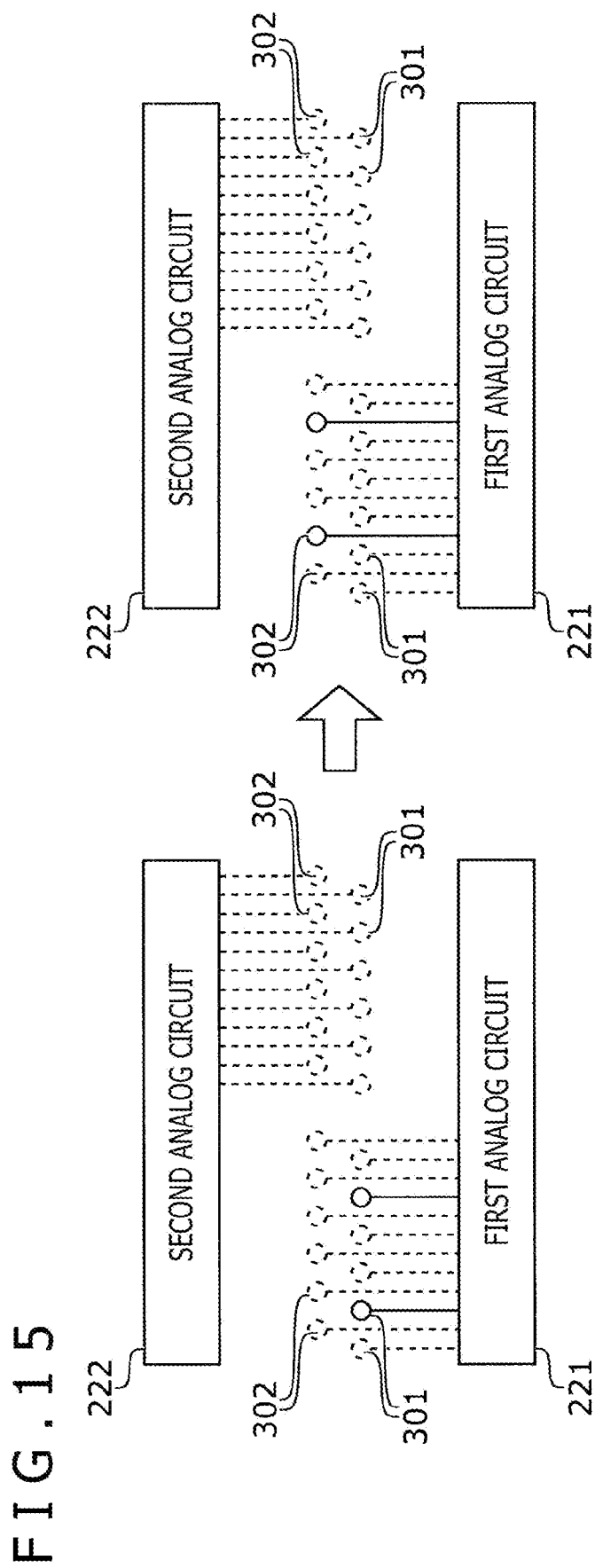
FIG. 15 is a diagram illustrating a wiring example of the analog circuit according to an embodiment.

For a four-pixel or two-pixel case, a further reduction in power consumption can be achieved by not using the second analog circuit 222. FIG. 15 is a diagram illustrating a case where the processing is applied to two rows for each column without using the second analog circuit 222. It is also possible to use only the first analog circuit 221 to process signals in parallel, without using the second analog circuit 222 in this manner. In this case, for example, even the control of the third switches 283 and the fifth switch 285 may be omitted, or the first switches 281 may be omitted while a time enough for a floating electric potential to be sufficiently charged is provided.

It is thus possible to appropriately switch the wiring lines according to the situation. The situation may involve predetermined conditions. For example, in a case where it is desired to capture a high-speed video, the processing is applied at high speed by using the configuration in FIG. 11 even though the power consumption increases. In contrast, in a case where a still image of an immobile object or the like is to be captured, the processing is applied with wiring lines being set such that power consumption is reduced as illustrated in FIG. 15.

Note that, in the present embodiment, the description is made on the case where the single pixel divider section and the single circuit divider section are provided; however, this is not limitative. In other words, even in a case where a plurality of second signal lines is provided in each space between pixels as in the present embodiment, the pixel array 14 and the analog circuit 22 may be divided smaller. In addition, the number of wiring lines for one column is not necessarily 12 and may be 11 or less or 13 or more.

(Implementation Example of Connection Sections)

Description will be made on a chip structure of the solid-state imaging apparatus 1 in FIG. 1. As described above, the solid-state imaging apparatus 1 is in the form of a stacked body with the first substrate 10 and the second substrate 20 stacked. The first substrate 10 and the second substrate 20 are each sometimes referred to as a die. For example, in FIG. 2, the first substrate 10 and the second substrate 20 are each in a rectangular shape; however, specific shape and size may be determined as desired. In addition, the first substrate 10 and the second substrate 20 may be the same in size or different in size.

The pixel array 14 illustrated in FIG. 4 and the like is located on the first substrate 10. In addition, at least part of the optical system 12 may be implemented in an on-chip manner in the first substrate 10.

While including at least the analog circuit 22, the logic circuit 24, and the input/output I/F 26, the second substrate 20 includes another necessary circuit. For example, a clock signal generation circuit that outputs a clock signal for determining a timing for the above-described row selection signal, synchronization signal, or the like may be provided. In addition, a control circuit that performs a comprehensive or partial control of each circuit may be provided.

As a specific manner of sticking the first substrate 10 and the second substrate 20 together, for example, what is generally called a CoC (Chip on Chip) technique may be employed; the first substrate 10 and the second substrate 20 are cut out of wafers and singulated, then being stuck to each other while vertically stacked. Alternatively, what is generally called a CoW (Chip on Wafer) technique may be employed; one of the first substrate 10 and the second substrate 20 (for example, the first substrate 10) is cut out of a wafer and singulated, and then the singulated first substrate 10 is stuck to the second substrate 20 not having been singulated. Alternatively, what is generally called a WoW (Wafer on Wafer) technique may be employed; the first substrate 10 and the second substrate 20 in a wafer state are stuck to each other.

A variety of bonding methods may be used to bond the first substrate 10 and the second substrate 20. For example, plasma bonding or the like is usable.

In bonding the first substrate 10 and the second substrate 20, in particular, bonding illustrated in the following figures may be used for the connection section, which electrically connects the first substrate 10 and the second substrate 20. Note that a detailed state of a circuit is not illustrated and only connection at the connection section is illustrated. Accordingly, in the figures, illustration of elements and the like of a variety of circuits is omitted. In addition, description will be made on the second signal line 181, but this similarly applies to the second signal lines 182 and the like.

Figure 16:
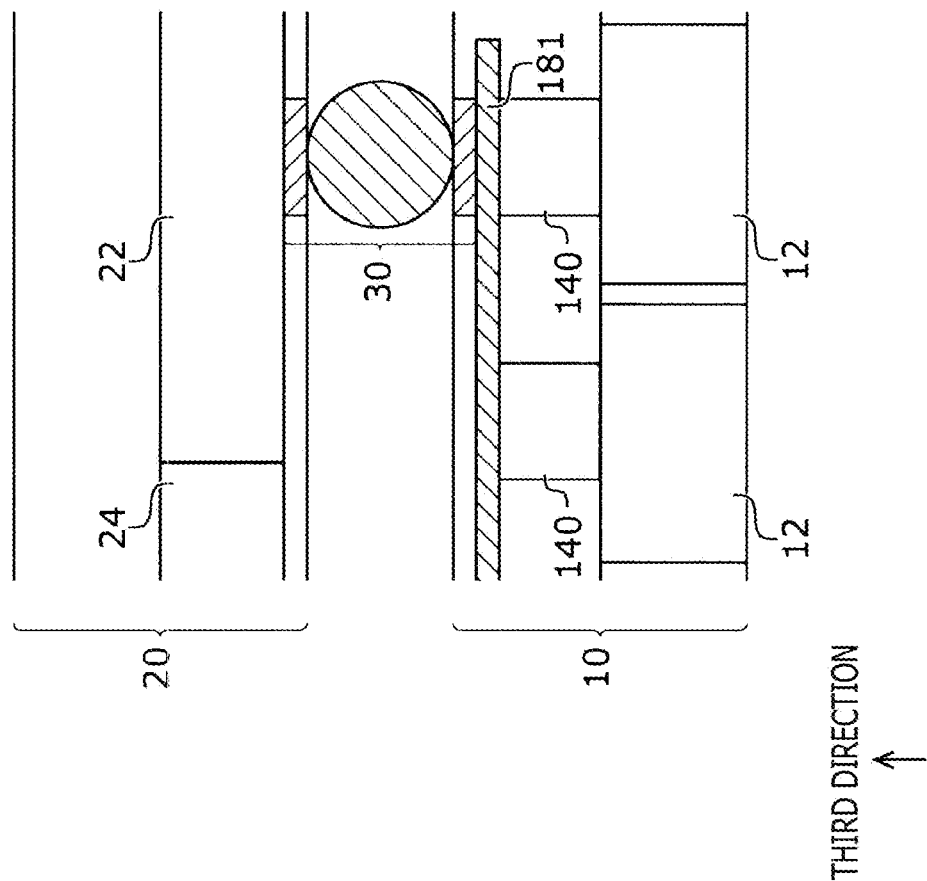
FIG. 16 is a diagram illustrating an example of a connection section according to an embodiment.

FIG. 16 is a diagram illustrating an example of the connection section. The figures mentioned below illustrate that, for example, the analog circuit 22 and the second signal line 181 are connected in an area where the second signal line 181 is present. The pixels 140, which receive light collected by the optical system 12, are connected to each other through the second signal line 181. The second signal line 181 is connected to the connection section 30, which includes, for example, a micro bump, thus being connected to the analog circuit 22. For example, respective micro pads may be formed on both a pixel 140 side and an analog circuit 22 side, and the micro pads are connected to each other through the micro bump.

Figure 17:
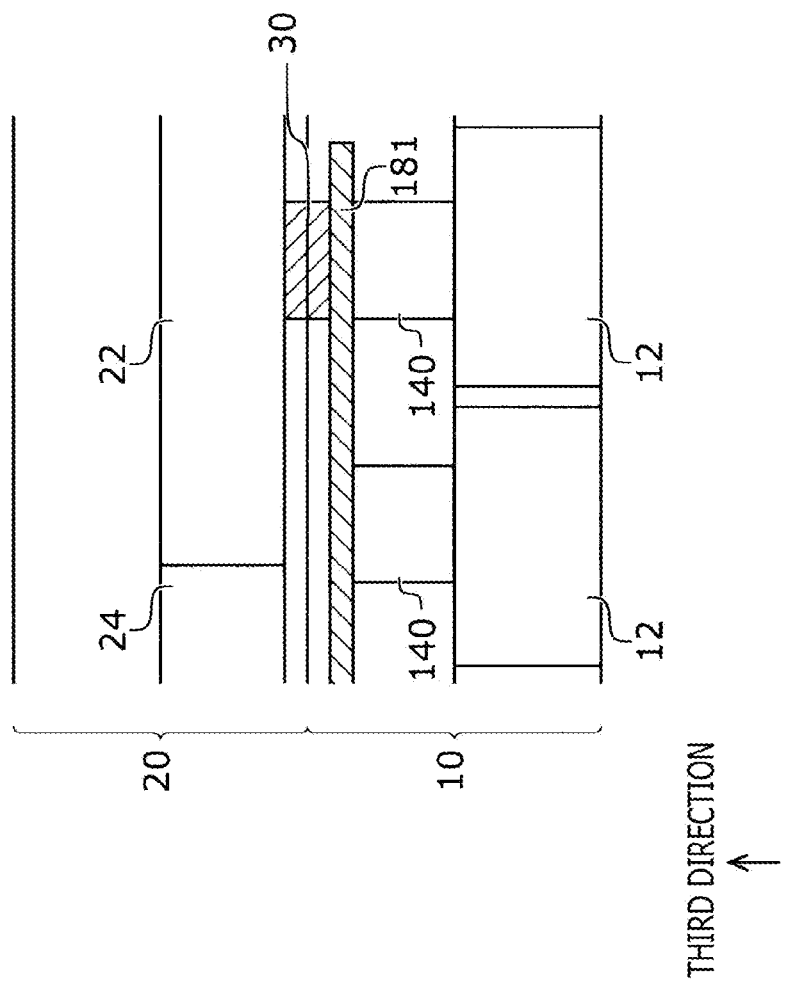
FIG. 17 is a diagram illustrating an example of the connection section according to an embodiment.

FIG. 17 is a diagram illustrating another example of the connection section. For example, the connection section 30 may be connected by micro pads as illustrated. The first substrate 10 and the second substrate 20 may be connected to each other directly by the micro pads with no micro bump in FIG. 16 interposed therebetween.

Figure 18:
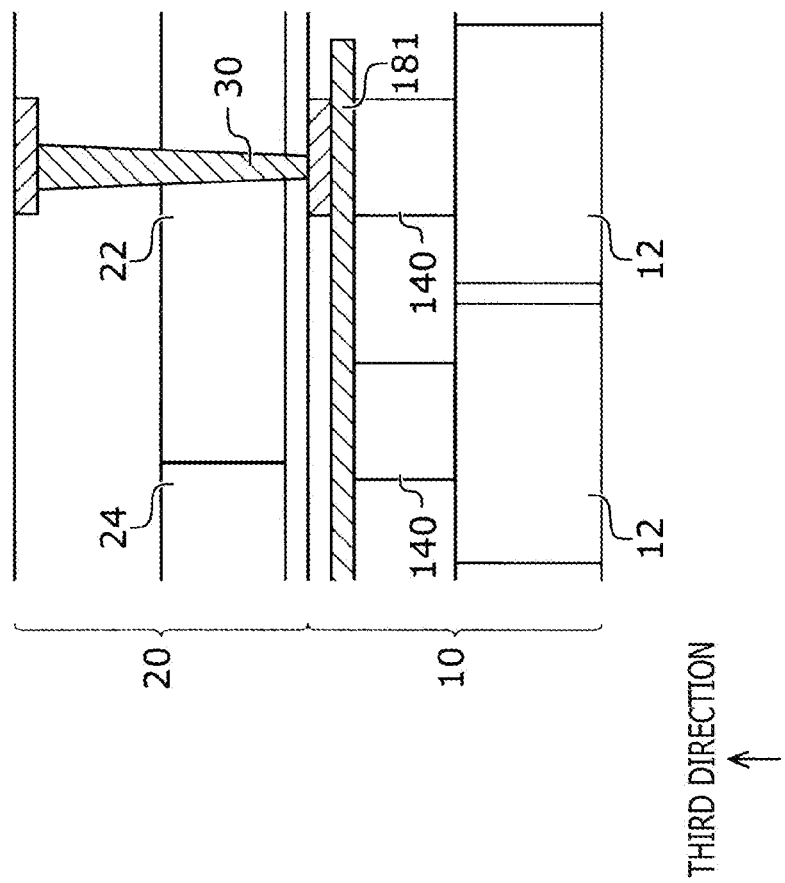
FIG. 18 is a diagram illustrating an example of the connection section according to an embodiment.

FIG. 18 is another example of the connection section. The connection section 30 may be in a form of, for example, a via hole, and the pixels 140 and the analog circuit 22 may be connected by bringing the via hole into contact with the second signal line 181 and the analog circuit 22.

In addition, the first substrate 10 and the second substrate 20, which are connected for the pixels 140 through the connection section 30, may be provided with an additional connection line for transmitting and receiving other signals, if necessary.

(Implementation Example of Second Substrate)

Figure 19:
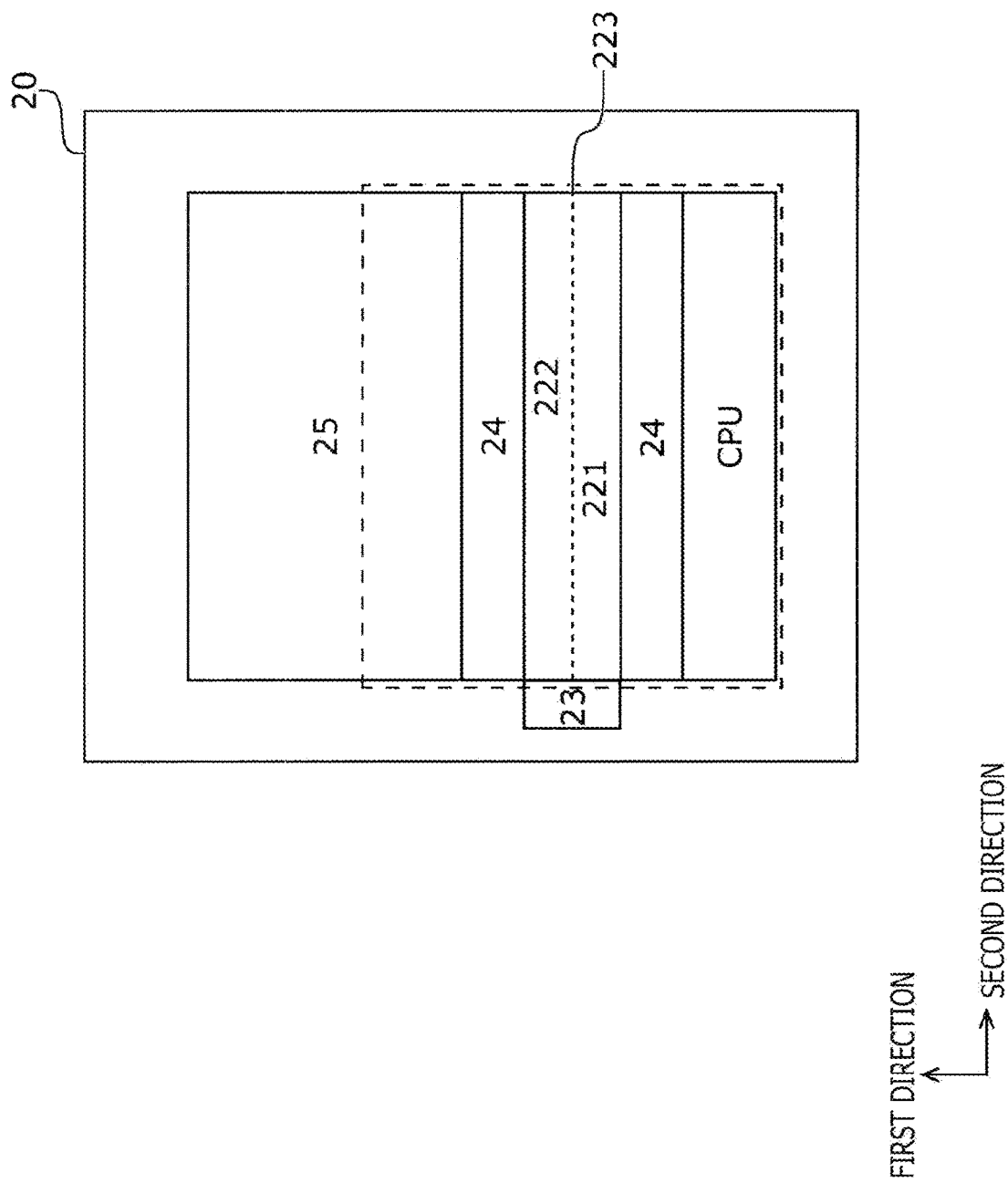
FIG. 19 is a diagram illustrating a location example of a circuit of the second substrate according to an embodiment.

Next, description will be made on an implementation example of the second substrate 20. FIG. 19 illustrates an example of implementation of the second substrate 20. An area indicated by broken lines in the second substrate 20 is an area where the pixel array 14 is present in the first substrate 10.

For example, in the second substrate 20, the first analog circuit 221 and the second analog circuit 222 are located such that the circuit divider section 223, which overlaps the pixel divider section in the third direction, is sandwiched therebetween. A DAC 23 may be provided adjacently to the analog circuits. For example, the logic circuit 24 is provided such that the analog circuit 22 is sandwiched thereby. The logic circuit 24 may include, for example, a first logic circuit adjacent to the first analog circuit 221 and a second logic circuit adjacent to the second analog circuit 222. In this case, the first logic circuit may process a signal outputted from the first analog circuit 221, and the second logic circuit may process a signal outputted from the second analog circuit 222.

In addition, a CPU (Central Processing Unit), or a control section, may be provided, if necessary. Further, a memory 25 may be provided as a storage section. The second substrate 20, which is a component independent of the pixels 140, includes a circuit necessary for the solid-state imaging apparatus 1 as above. In addition, although not illustrated, a selector, the input/output I/F 26, and the like may be provided.

Figure 20:
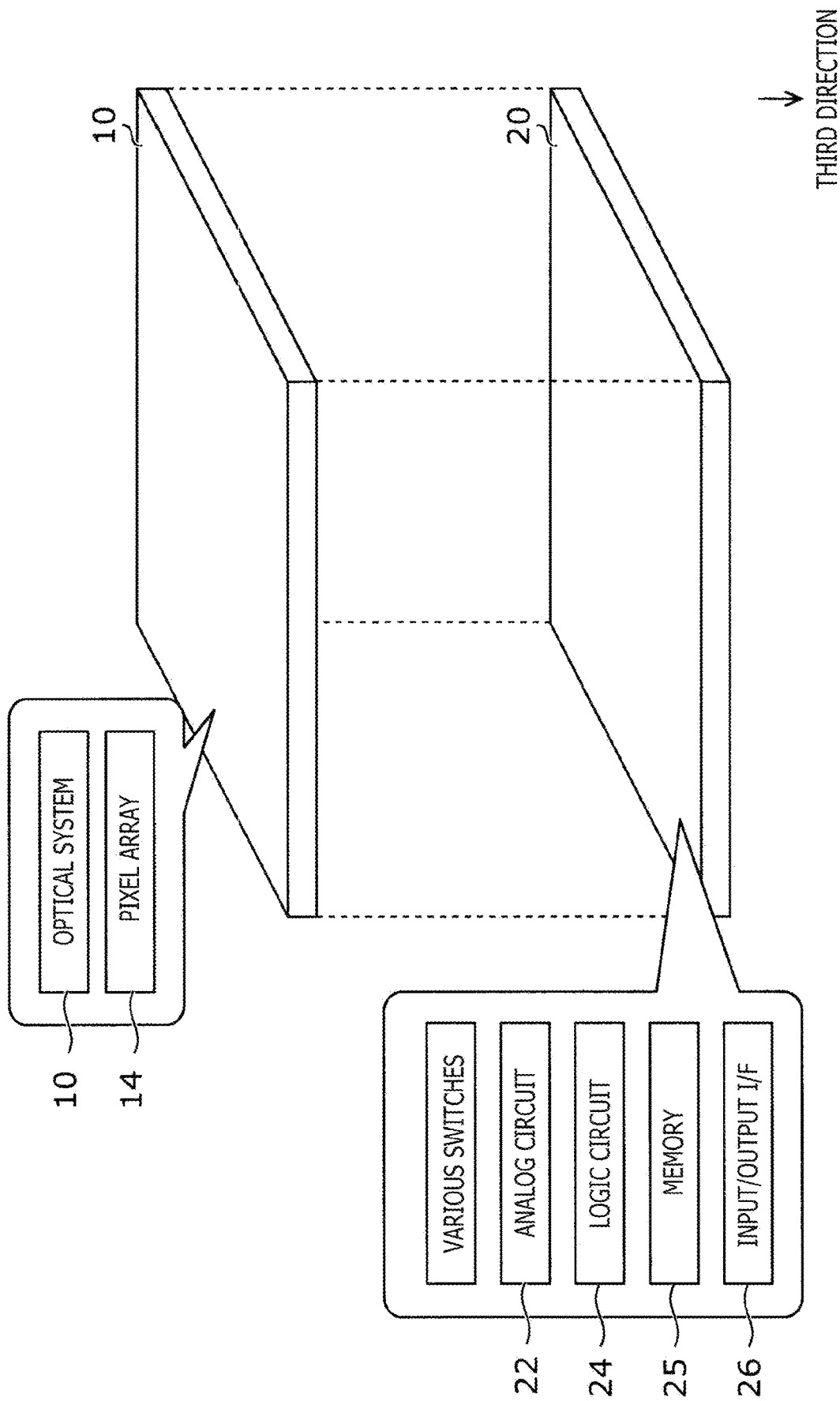
FIG. 20 is a diagram illustrating a stacked state of the solid-state imaging apparatus according to an embodiment.

FIG. 20 illustrates an example of the solid-state imaging apparatus 1 being in a two-layer form. The first substrate 10 includes the optical system and the pixel array 14 including the two-dimensionally arrayed pixels 140. The first substrate 10 also includes wiring lines or the like necessary for extracting information regarding the pixels, such as the first signal lines and the second signal lines.

The second substrate 20 includes the variety of switches that switch the connection states between the connection sections for connection to the first substrate 10, the analog circuit 22, the logic circuit 24, the memory 25, and the input/output I/F 26. In addition to these, the second substrate 20 includes a circuit necessary for controlling the solid-state imaging apparatus 1.

Figure 21:
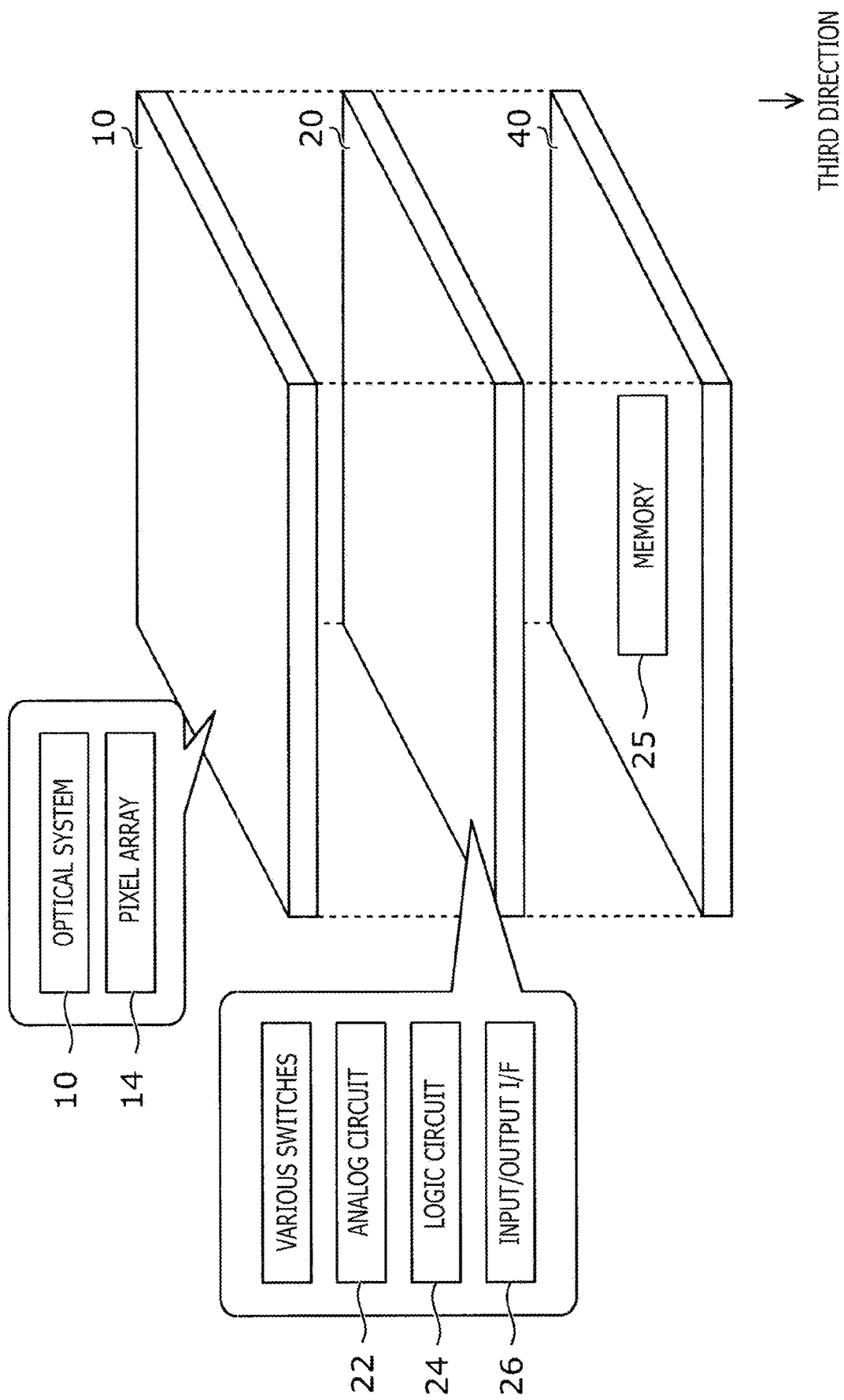
FIG. 21 is a diagram illustrating a stacked state of the solid-state imaging apparatus according to an embodiment.

FIG. 21 is a diagram illustrating an example of the solid-state imaging apparatus 1 being in a three-layer form. The elements of the first substrate 10 and the second substrate 20 are substantially the same as those in FIG. 19. However, the second substrate 20 includes no memory, and a third substrate 40 includes a memory. In FIG. 20, the third substrate 40 is located below the second substrate 20; however, this is not limitative. In other words, the third substrate 40 may be provided between the first substrate 10 and the second substrate 20.

Even in the case where the solid-state imaging apparatus 1 has three layers, connection between the layers is similar to that in the above-described embodiments; for example, the layers are connected to each other by a connection method as illustrated in FIG. 16 to FIG. 18.

Figure 22:
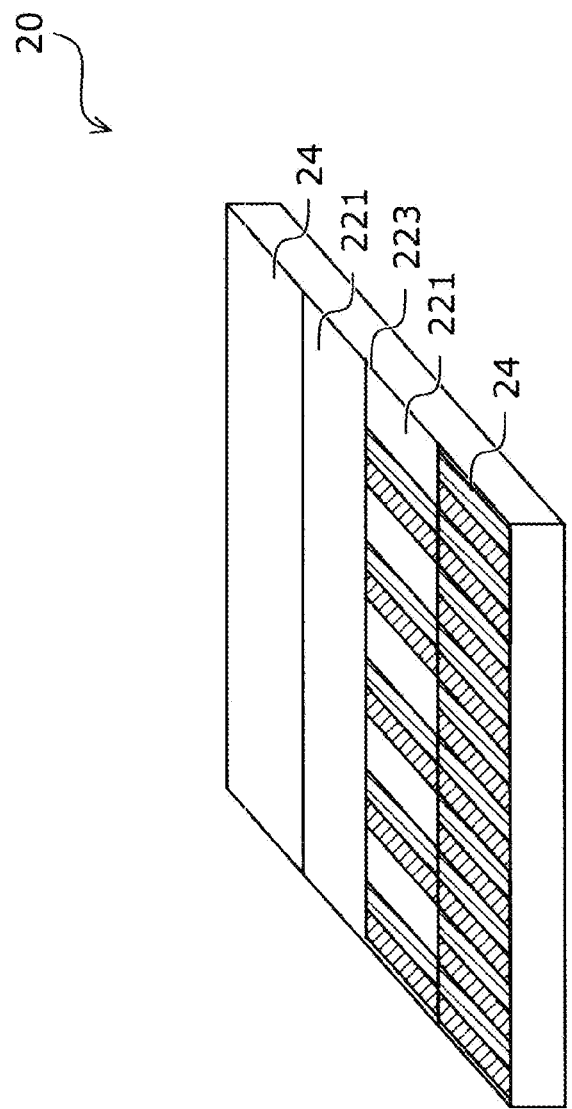
FIG. 22 is a diagram illustrating voltage application of the analog circuit according to an embodiment.

FIG. 22 is a diagram illustrating an example of a location of a power source in the analog circuit 22 of the second substrate 20. In the figure, it is only drawn how the power source is at a spot corresponding to the first analog circuit 221 with consideration for visibility; however, a power source is likewise located on a second analog circuit 222 side.

In the figure, for example, hatched portions indicated by slanting lines inclined upward left are wiring lines through which a power voltage is to be applied, whereas hatched portions indicated by slanting lines inclined upward right are wiring lines connected to a ground voltage. The first analog circuit 221 is thus provided with the wiring lines for the power voltage and the wiring lines for the ground voltage at regular intervals. The power source is seen on a surface for convenience of understanding; however, it is not on the surface but is embedded, for example, under the circuits of the second substrate 20.

The analog circuit 22 is located at the middle, which elongates the power source wiring lines on a chip of the second substrate 20. This causes the power voltage observed at an end of the analog circuit 22 to decrease by an amount corresponding to a resistance of the wiring lines and a consumption current. In such a case, unevenness of arrangement of the power source wiring lines further causes shading properties in the second direction to be deteriorated. To avoid this, the power source wiring lines are evenly arranged along the second direction, thereby achieving equalization of the power source in a horizontal direction. As a result, shading in the second direction can be reduced.

All the embodiments are described with a CMOS sensor taken as an example; however, this is not limitative. The present disclosure is applicable to a CCD (Charge Coupled Device) and other types of light-receptive devices. For example, for a CCD, charges of the rows selected through a via are caused to propagate in sequence and processed by the analog circuit, thereby making it possible to achieve similar workings and effects.

The present disclosure is usable in an indirect ToF sensor.

Figure 23:
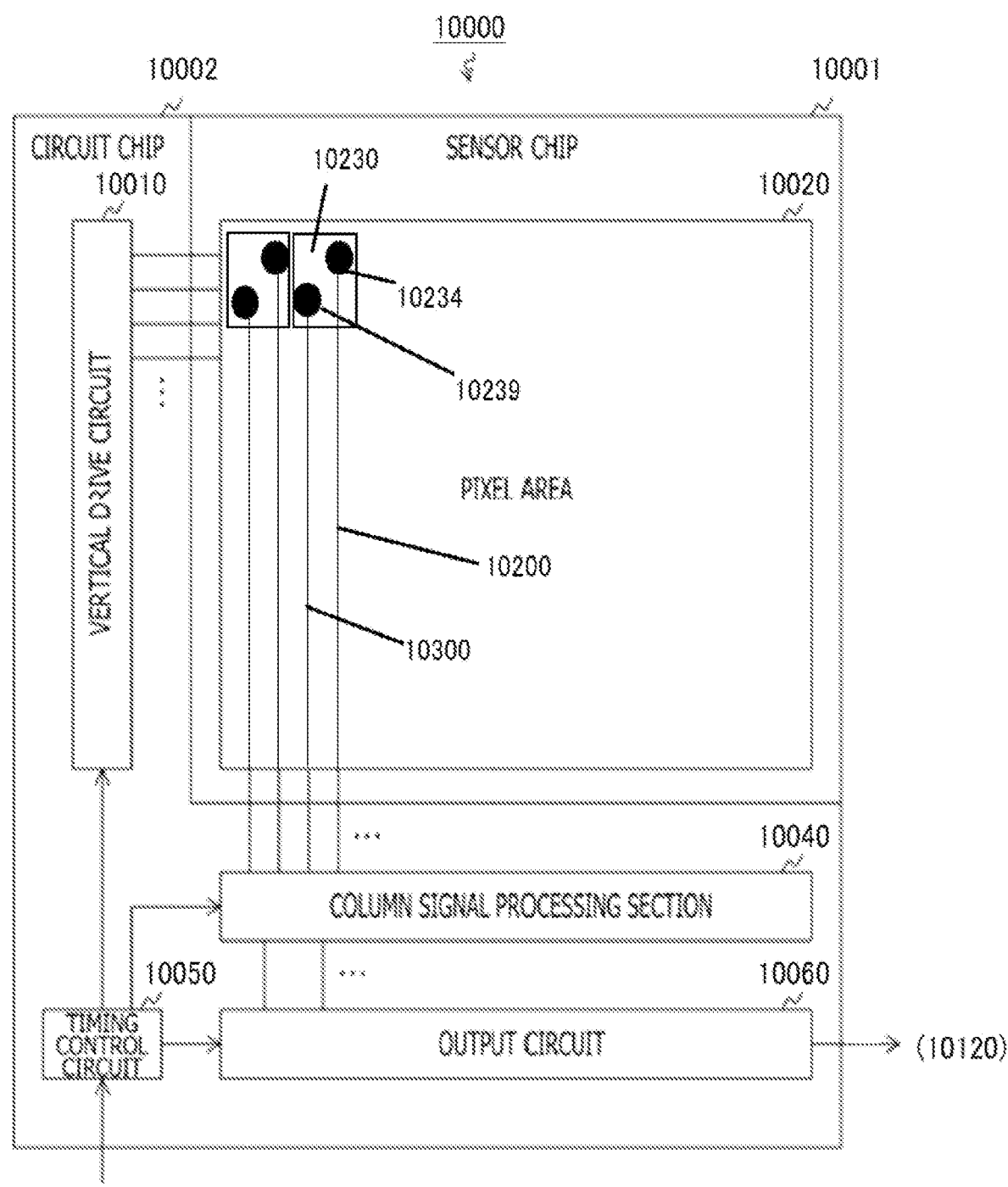
FIG. 23 is a block diagram illustrating an example of an Indirect-Time of Flight sensor to which the present technique is applied.

FIG. 23 is a block diagram illustrating an example of an Indirect-Time of Flight sensor to which the present technique is applied.

[Configuration Example of Indirect-Time of Flight Sensor]

FIG. 23 is a block diagram illustrating an example of an Indirect-Time of Flight sensor 10000 to which an embodiment of the present technique is applied. The Indirect-Time of Flight sensor 10000 includes a sensor chip 10001 and a circuit chip 10002 laminated on the sensor chip 10001.

A pixel area 10020 including a plurality of pixels arrayed in a two-dimensional grid pattern is arranged on the sensor chip. The pixel area 10020 may be arranged in rows and columns, and may include a plurality of column signal lines. Each of the column signal lines is coupled to each pixel. In addition, a vertical drive circuit 10010, a column signal processing circuit 10040, a timing adjustment circuit 10050, and an output circuit 10060 are arranged on the circuit chip 10002.

The vertical drive circuit 10010 is configured to drive pixels and output pixel signals to the column signal processing section 10040. The column signal processing section 10040 applies an analog to digital (AD) conversion process to the pixel signals and outputs the pixel signals that have been subjected to the AD conversion process to the output circuit. The output circuit 10060 applies a CDS (Correlated Double Sampling) process or the like to the data from the column signal processing section 10040 and outputs the data to a signal processing circuit 10120 in a subsequent stage.

The timing control circuit 10050 is configured to control respective drive timings of the vertical drive circuit 10010. The column signal processing section and the output circuit 10060 operate in synchronization with a vertical synchronization signal.

The pixel area 10020 includes a plurality of pixels arrayed in a two-dimensional grid pattern. Each of the pixels is configured to be capable of receiving infrared light and photoelectrically converting the infrared light to a pixel signal.

In addition, vertical signal lines VSL1 and VSL2 are wired in a vertical direction in each column of the pixels 10230. Assuming that the total number of columns in the pixel area 10020 is M (M is an integer), a total of 2×M vertical signal lines are wired. Each of the pixels has two taps. The vertical signal line VSL1 is connected to a Tap A of the pixel 10230, and the vertical signal line VSL2 is connected to a Tap B of the pixel 10230. In addition, the vertical signal line VSL1 transmits a pixel signal AINP1, and the vertical signal line VSL2 transmits a pixel signal AINP2.

The vertical drive circuit 210 sequentially selects and drives a row of pixel blocks 221 to cause the pixel signals AINP1 and AINP2 to be outputted at the same time from each pixel block 221 in the row. In other words, the vertical drive circuit 210 drives a 2k-th row and a (2k+1)-th row of the pixels 230 at the same time. Note that the vertical drive circuit 210 is an example of a drive circuit described in the claims.

Figure 24:
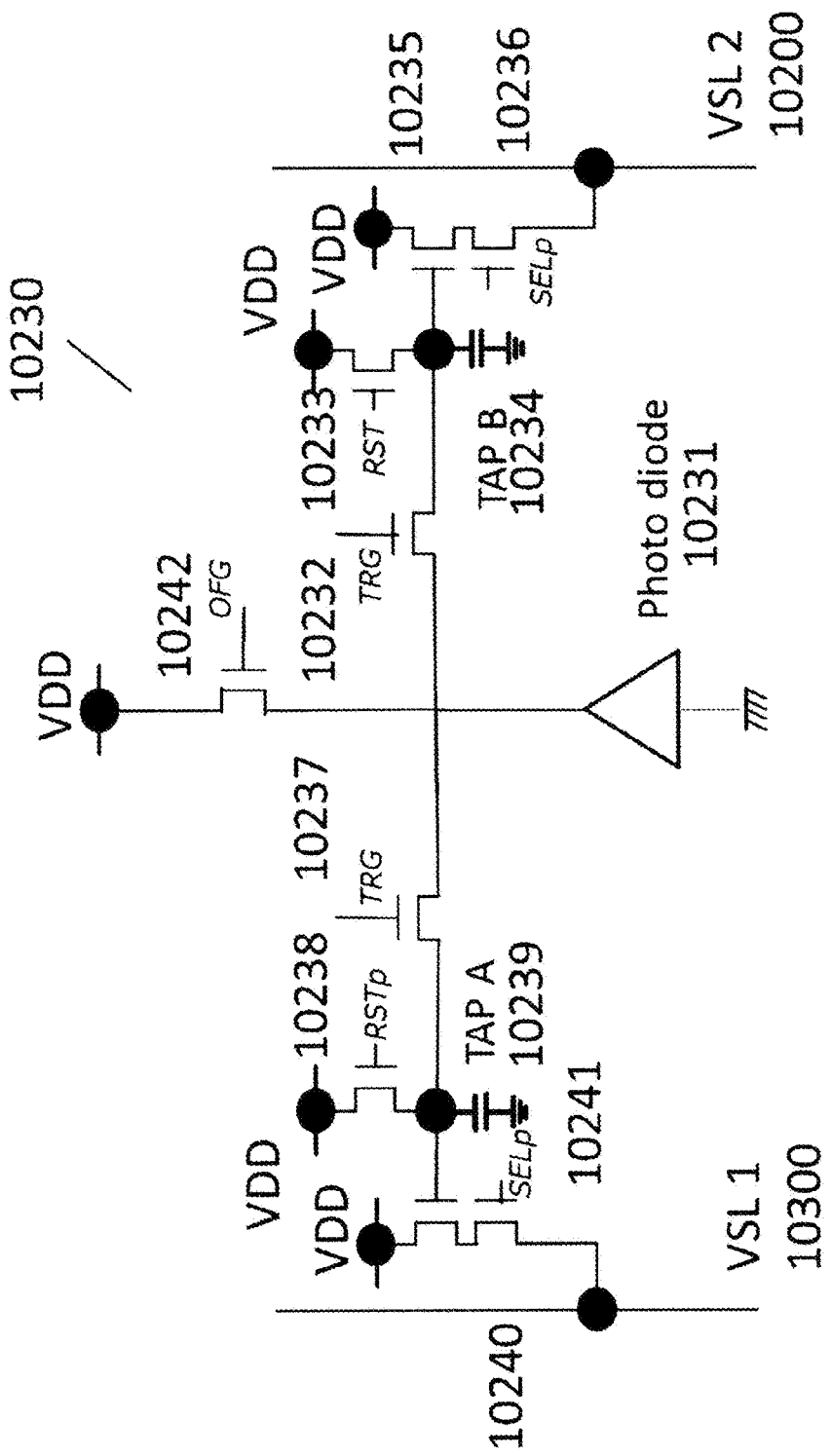
FIG. 24 is a circuit diagram illustrating a configuration example of a pixel 10230 in an embodiment of the present technique.

FIG. 24 is a circuit diagram illustrating a configuration example of the pixel 10230 according to a mode of the present technique. The pixel 10230 includes a photodiode 10231, two transfer transistors 10232 and 10237, two reset transistors 10233 and 10238, two Taps (floating diffusion layers 10234 and 10239), two amplifier transistors 10235 and 10239, and two selection transistors 10236 and 10241.

The photodiode 10231 is configured to photoelectrically convert received light to generate charges. The photodiode 10231 is arranged on a back side of a semiconductor substrate, opposite to a front side thereof where circuits are disposed. Such a solid-state imaging element is called a back-illuminated solid-state imaging element. Note that, instead of the back-illuminated type, a front-illuminated configuration including the photodiode 10231 arranged on the front side may also be used.

The transfer transistor 10232 is configured to sequentially transfer charges from the photodiode 10231 to the Tap A 10239 and the Tap B 10234, according to transfer signals TRG from the vertical drive circuit 10010. The Tap A 10239 and the Tap B 10234 are configured to accumulate the transferred charges to generate a voltage according to the amount of accumulated charges.

An overflow transistor 10242 is a transistor configured to sequentially discharge charges of the photodiode 10231 to a VDD and has a function of resetting the photodiode.

The reset transistors 10238 and 10233 are configured to pull out charges from the Tap A 10239 and the Tap B 10234, respectively, according to reset signals RSTp from the vertical drive circuit 210 to initialize the amount of charges. The amplifier transistors 10240 and 10235 are configured to amplify the voltage of the Tap A 10239 and the Tap B 10234, respectively. The selection transistors 10236 and 10241 are configured to output pixel signals that are signals of the amplified voltages to the column signal processing section 10040 through the two vertical signal lines (for example, VSL1 and VSL2) according to selection signals SELp from the vertical drive circuit 210. VSL1 and VSL2 are connected to an input of an analog to digital converter in the column signal processing circuit 10040.

Note that the circuit configuration of the pixels 230 is not limited to the configuration illustrated by way of example in FIG. 23 as long as a pixel signal is allowed to be generated by photoelectric conversion.

The technique according to the present disclosure (the present technique) is applicable to a variety of products. For example, the technique according to the present disclosure may be implemented as a device to be mounted in any type of moving bodies such as an automobile, an electric vehicle, a hybrid electric vehicle, a motorcycle, a bicycle, a personal mobility, an airplane, a drone, a ship, and a robot.

Figure 25:
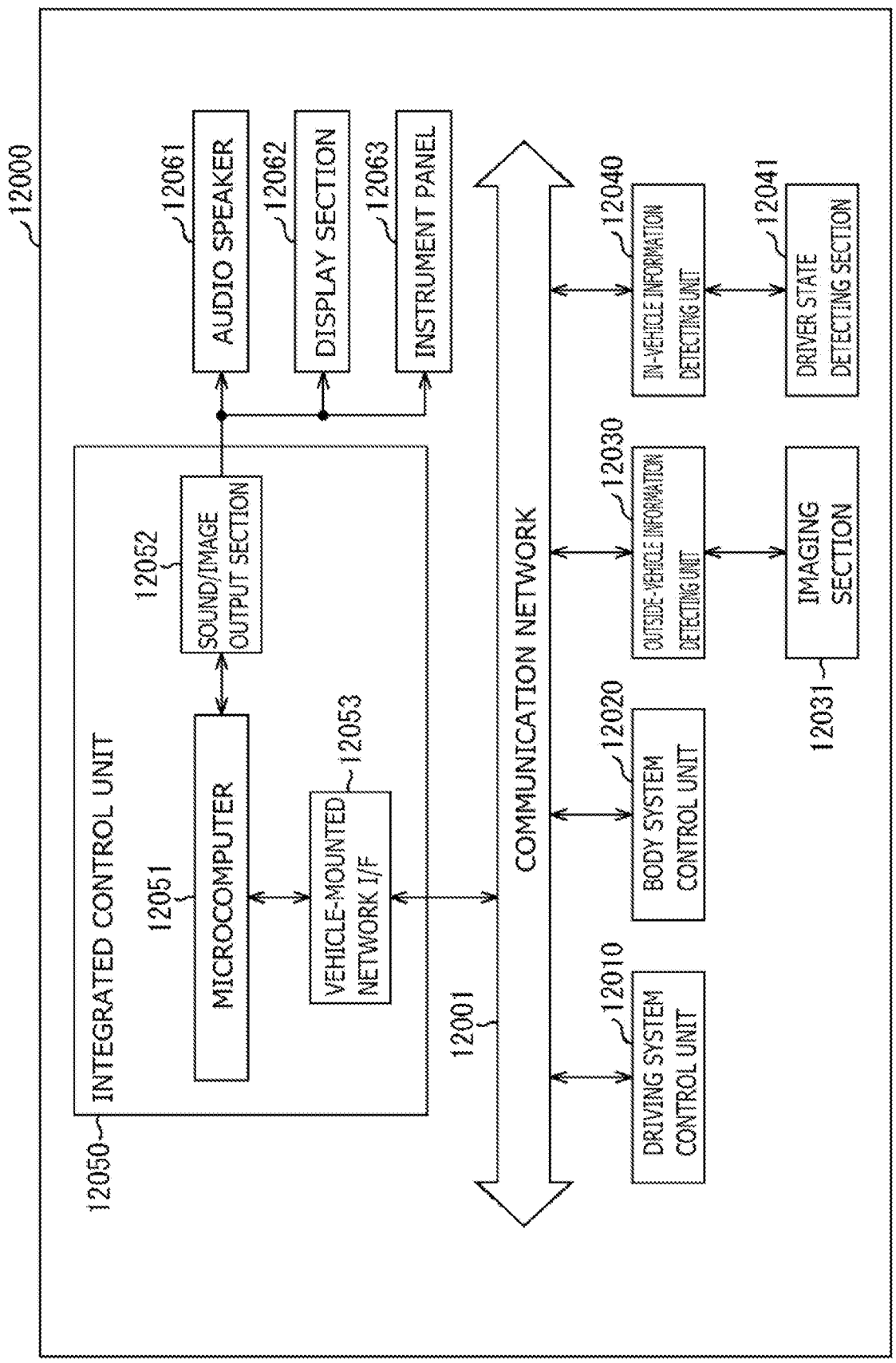
FIG. 25 is a block diagram depicting an example of schematic configuration of a vehicle control system.

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG.

25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 25, an audio speaker 12061, a display section 12062, and an instrument panel 12063 are illustrated as the output device. The display section 12062 may, for example, include at least one of an on-board display and a head-up display.

Figure 26:
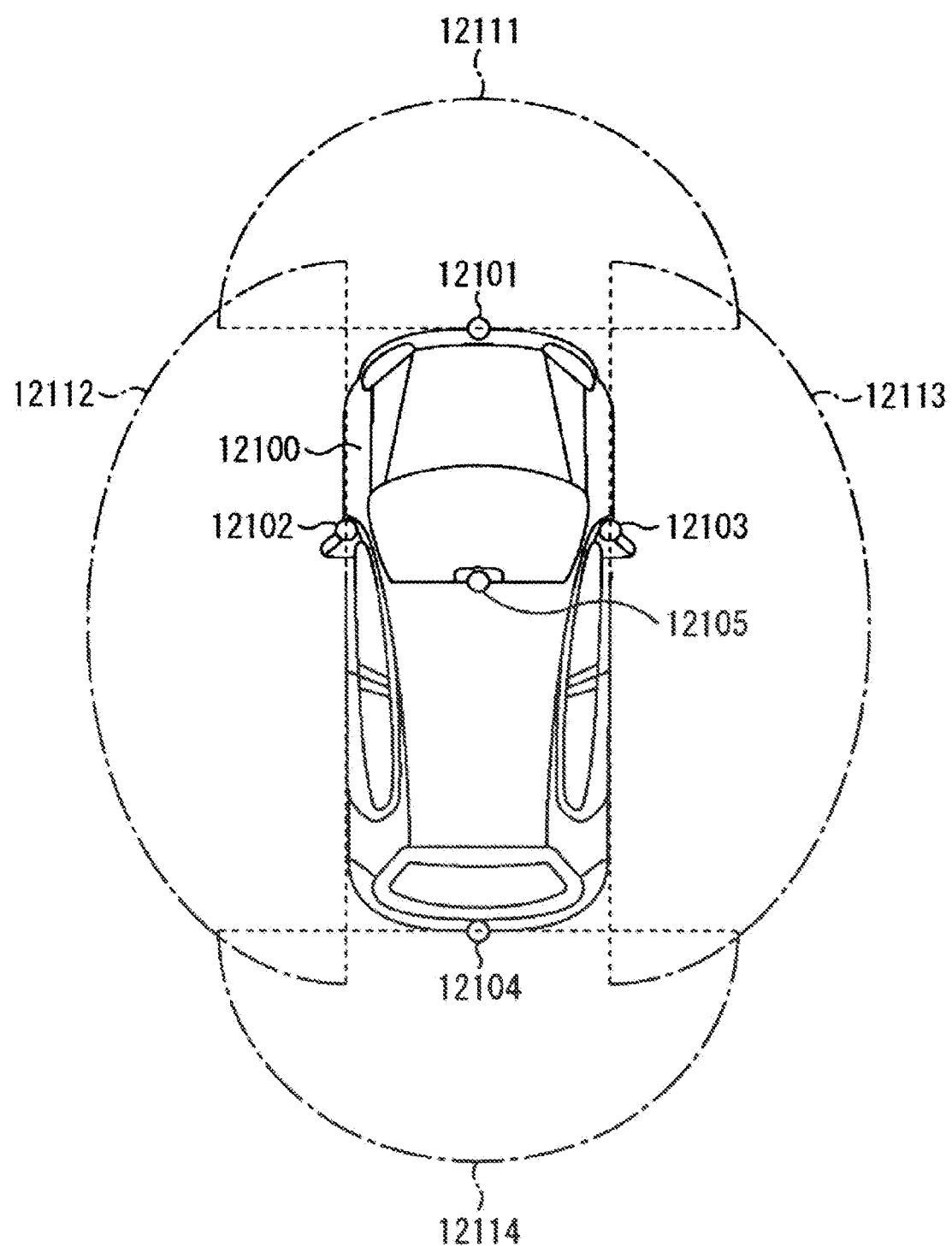
FIG. 26 is a diagram of assistance in explaining an example of installation positions of an outside-vehicle information detecting section and an imaging section.

FIG. 26 is a diagram depicting an example of the installation position of the imaging section 12031.

In FIG. 26, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above-described embodiments may be provided as follows.

(1) A solid-state imaging apparatus including:
  a first substrate including a pixel array in which a plurality of pixels configured to output analog signals by photoelectric conversion is two-dimensionally arrayed in columns along a first direction and rows along a second direction intersecting the first direction; and
  a second substrate stacked on the first substrate, the second substrate including an analog circuit that is located with an overlap with the pixel array in a third direction intersecting the first direction and the second direction and processes the analog signals outputted from the pixels, in which
  the pixel array is divided by a pixel divider section along the second direction into a first area and a second area each including continuous ones of the pixels, and
  the analog circuit is divided into a first analog circuit and a second analog circuit that are connected to the pixels belonging to the first area and the pixels belonging to the second area, the first analog circuit and the second analog circuit being adjacent to each other with a circuit divider section interposed therebetween, the circuit divider section being located with an overlap with the pixel divider section in the third direction.

(2) The solid-state imaging apparatus according to (1), in which
  the pixel array includes a plurality of first signal lines that is arranged along the first direction and selects, from among the rows having the pixels continuous in the second direction, one or more of the rows in the first direction, and
  the analog signals outputted from the pixels selected by the first signal lines are processed by the analog circuit.

(3) The solid-state imaging apparatus according to (2), in which
  the pixel array includes a plurality of second signal lines that is arranged along the second direction and selects, from among the columns having the pixels continuous in the first direction, one or more of the columns in the second direction,
  the analog signals outputted from the pixels selected by the first signal lines are transmitted through the second signal lines and processed by the analog circuit, and
  the second signal lines are electrically separated at the pixel divider section.

(4) The solid-state imaging apparatus according to (3), in which the pixel divider section and the circuit divider section are located near a middle of the pixel array in the first direction.

(5) The solid-state imaging apparatus according to (3), including:
  a connection section configured to connect the pixels and the analog circuit in the third direction at the pixel divider section and the circuit divider section.

(6) The solid-state imaging apparatus according to (5), in which
  the connection section includes a first connection section connected to the second signal lines and configured to connect the pixels belonging to the first area and the first analog circuit through the second signal lines, and a second connection section connected to the second signal lines and configured to connect the pixels belonging to the second area and the second analog circuit through the second signal lines.

(7) The solid-state imaging apparatus according to (6), including:

a first switch configured to switch a connection state between the first connection section and the second connection section.

(8) The solid-state imaging apparatus according to (7), in which, on the basis of a timing of the analog signals being outputted to the analog circuit through the first connection section or the second connection section, the first switch switches the connection state between the first connection section and the second connection section.

(9) The solid-state imaging apparatus according to (7) or (8), in which a plurality of the first connection sections, a plurality of the second connection sections, and a plurality of the first switches are provided along the second direction, and the plurality of first switches operates in a synchronous manner.

(10) The solid-state imaging apparatus according to (6) to (9), in which a plurality of the first connection sections and a plurality of the second connection sections are provided along the second direction, the solid-state imaging apparatus includes:

a second switch configured to switch a connection state between the plurality of first connection sections; and a third switch configured to switch a connection state between the plurality of second connection sections.

(11) The solid-state imaging apparatus according to (10), in which, on the basis of a timing of the analog signals being outputted to the analog circuit through the first connection sections or the second connection sections, the second switch switches the connection state between the first connection sections, and the third switch switches the connection state between the second connection sections.

(12) The solid-state imaging apparatus according to (10) or (11), in which the second switch and the third switch operate in a synchronous manner.

(13) The solid-state imaging apparatus according to (10) or (11), in which a plurality of the second switches and a plurality of the third switches are provided along the second direction, and the plurality of second switches and the plurality of third switches operate in a synchronous manner.

(14) The solid-state imaging apparatus according to any one of (10) to (13), including:

a first voltage source configured to apply a predetermined voltage to the plurality of first connection sections connected through the second switch; and a fourth switch configured to switch a connection state between the first voltage source and the plurality of first connection sections, in which the second switch and the fourth switch operate in a synchronous manner.

(15) The solid-state imaging apparatus according to any one of (10) to (14), including:

a second voltage source configured to apply a predetermined voltage to the plurality of second connection sections connected through the third switch; and a fifth switch configured to switch a connection state between the second voltage source and the plurality of second connection sections, in which the third switch and the fifth switch operate in a synchronous manner.

(16) The solid-state imaging apparatus according to any one of (6) to (15), in which the first connection section and the second connection section are each at least as many as the number of the pixels existing in the rows.

(17) The solid-state imaging apparatus according to (16), in which the first connection section and the second connection section are each at least as many as a product of the number of the pixels existing in the rows and a predetermined number.

(18) The solid-state imaging apparatus according to any one of (5) to (17), in which the connection section is in a form of a micro bump, a micro pad, or a via hole.

(19) The solid-state imaging apparatus according to any one of (1) to (18), in which the first analog circuit and the second analog circuit process the analog signals from the different pixels belonging to one or more of the rows along the second direction at the same timing.

(20) The solid-state imaging apparatus according to (19), in which the first analog circuit and the second analog circuit change the number of the analog signals to be processed at the same timing, according to predetermined conditions.

(21) The solid-state imaging apparatus according to (20), in which the analog circuit converts the analog signals to digital signals, and the solid-state imaging apparatus includes a logic circuit configured to process the digital signals.

(22) The solid-state imaging apparatus according to (21), in which the logic circuit is located with the analog circuit sandwiched thereby in the first direction.

(23) The solid-state imaging apparatus according to (21) or (22), in which the logic circuit includes a first logic circuit configured to process the digital signals outputted from the first analog circuit, and a second logic circuit configured to process the digital signals outputted from the second analog circuit.

(24) The solid-state imaging apparatus according to (1), including:

a plurality of the pixel divider sections and a plurality of the circuit divider sections; and the pixel array divided into a plurality of areas and the analog circuit corresponding to each of the areas.

(25) The solid-state imaging apparatus according to any one of (1) to (24), in which the second substrate includes a signal processing circuit configured to perform signal processing of the digital signals, an image processing circuit configured to perform image processing of the digital signals, the digital signals including image information, a storage section configured to store data freely selected from among the digital signals, data outputted from the signal processing circuit, and data outputted from the image processing circuit, a selector configured to freely select at least one of the data outputted from the signal processing circuit, the data outputted from the image processing circuit, or the data stored in the storage section, and an interface configured to externally output data selected by the selector or a signal or externally receive input of data or a signal.

(26) The solid-state imaging apparatus according to any one of (7) to (15), in which all the switches operate in a synchronous manner.

(27) The solid-state imaging apparatus according to (26), in which synchronization is performed at a timing based on a timing of reset of the pixels or a timing of output of the analog signals from the pixels.

An aspect of the present disclosure is not limited to the above-described embodiments; it includes various conceivable modifications, and the effects of the present disclosure are not limited to the above-described contents. The components of the embodiments may be used in combination, if necessary. In other words, various additions, changes, and partial deletions are possible without departing from the conceptual idea and scope of the present disclosure derived from the contents defined in the claims and their equivalents.

REFERENCE SIGNS LIST

1: Solid-state imaging apparatus
10: First substrate
12: Optical system
14: Pixel array
140: Pixel
141, 141A, 141B: First area
142, 142A, 142B: Second area
143, 143A, 143B, 143C: Pixel divider section
16: First signal line
181, 182: Second signal line
20: Second substrate
22, 22A, 22B: Analog circuit
221, 221A, 221B: First analog circuit
222, 222A, 222B: Second analog circuit
223, 223A, 223B, 223C: Circuit divider section
23: DAC
24: Logic circuit
25: Memory
26: Input/output I/F
281: First switch
282: Second switch
283: Third switch
284: Fourth switch
285: Fifth switch
30: Connection section
301: First connection section
302: Second connection section

The invention claimed is:

1. A solid-state imaging apparatus comprising:
a first substrate including a pixel array in which a plurality of pixels configured to output analog signals by photoelectric conversion is two-dimensionally arrayed in columns along a first direction and rows along a second direction intersecting the first direction; and
a second substrate stacked on the first substrate, the second substrate including an analog circuit that is located with an overlap with the pixel array in a third direction intersecting the first direction and the second direction and processes the analog signals outputted from the pixels, wherein
the pixel array is divided by a pixel divider section along the second direction into a first area and a second area each including continuous ones of the pixels, and
the analog circuit is divided into a first analog circuit and a second analog circuit that are connected to the pixels belonging to the first area and the pixels belonging to the second area, the first analog circuit and the second analog circuit being adjacent to each other with a circuit divider section interposed therebetween, the circuit divider section being located with an overlap with the pixel divider section in the third direction.

2. The solid-state imaging apparatus according to claim 1, wherein
the pixel array includes
a plurality of first signal lines that is arranged along the first direction and selects, from among the rows having the pixels continuous in the second direction, one or more of the rows in the first direction, and
a plurality of second signal lines that is arranged along the second direction and selects, from among the columns having the pixels continuous in the first direction, one or more of the columns in the second direction,
the analog signals outputted from the pixels selected by the first signal lines are transmitted through the second signal lines and processed by the analog circuit, and
the second signal lines are electrically separated at the pixel divider section.

3. The solid-state imaging apparatus according to claim 2, wherein the pixel divider section and the circuit divider section are located near a middle of the pixel array in the first direction.

4. The solid-state imaging apparatus according to claim 2, comprising:
a connection section configured to connect the pixels and the analog circuit in the third direction at the pixel divider section and the circuit divider section.

5. The solid-state imaging apparatus according to claim 4, wherein
the connection section includes
a first connection section connected to the second signal lines and configured to connect the pixels belonging to the first area and the first analog circuit through the second signal lines, and
a second connection section connected to the second signal lines and configured to connect the pixels belonging to the second area and the second analog circuit through the second signal lines.

6. The solid-state imaging apparatus according to claim 5, comprising:
a first switch configured to switch a connection state between the first connection section and the second connection section.

7. The solid-state imaging apparatus according to claim 6, wherein,
on a basis of a timing of the analog signals being outputted to the analog circuit through the first connection section or the second connection section, the first switch switches the connection state between the first connection section and the second connection section.

8. The solid-state imaging apparatus according to claim 6, wherein a plurality of the first connection sections, a plurality of the second connection sections, and a plurality of the first switches are provided along the second direction, and the plurality of first switches operates in a synchronous manner.

9. The solid-state imaging apparatus according to claim 5, wherein a plurality of the first connection sections and a plurality of the second connection sections are provided along the second direction, the solid-state imaging apparatus comprises:

a second switch configured to switch a connection state between the plurality of first connection sections; and a third switch configured to switch a connection state between the plurality of second connection sections.

10. The solid-state imaging apparatus according to claim 9, wherein, on a basis of a timing of the analog signals being outputted to the analog circuit through the first connection sections or the second connection sections, the second switch switches the connection state between the first connection sections, and the third switch switches the connection state between the second connection sections.

11. The solid-state imaging apparatus according to claim 9, wherein the second switch and the third switch operate in a synchronous manner.

12. The solid-state imaging apparatus according to claim 9, wherein a plurality of the second switches and a plurality of the third switches are provided along the second direction, and the plurality of second switches and the plurality of third switches operate in a synchronous manner.

13. The solid-state imaging apparatus according to claim 9, comprising:

a first voltage source configured to apply a predetermined voltage to the plurality of first connection sections connected through the second switch; and a fourth switch configured to switch a connection state between the first voltage source and the plurality of first connection sections, wherein the second switch and the fourth switch operate in a synchronous manner.

14. The solid-state imaging apparatus according to claim 9, comprising:

a second voltage source configured to apply a predetermined voltage to the plurality of second connection sections connected through the third switch; and a fifth switch configured to switch a connection state between the second voltage source and the plurality of second connection sections, wherein the third switch and the fifth switch operate in a synchronous manner.

15. The solid-state imaging apparatus according to claim 1, wherein the first analog circuit and the second analog circuit process the analog signals from the different pixels belonging to one or more of the rows along the second direction at a same timing.

16. The solid-state imaging apparatus according to claim 15, wherein the first analog circuit and the second analog circuit change the number of the analog signals to be processed at the same timing, according to predetermined conditions.

17. The solid-state imaging apparatus according to claim 16, wherein the analog circuit converts the analog signals to digital signals, and the solid-state imaging apparatus comprises a logic circuit configured to process the digital signals.

18. The solid-state imaging apparatus according to claim 17, wherein the logic circuit is located with the analog circuit sandwiched thereby in the first direction.

19. The solid-state imaging apparatus according to claim 1, comprising:

a plurality of the pixel divider sections and a plurality of the circuit divider sections; and the pixel array divided into a plurality of areas and the analog circuit corresponding to each of the areas.

20. The solid-state imaging apparatus according to claim 1, wherein the second substrate includes a signal processing circuit configured to perform signal processing of the digital signals, an image processing circuit configured to perform image processing of the digital signals, the digital signals including image information, a storage section configured to store data freely selected from among the digital signals, data outputted from the signal processing circuit, and data outputted from the image processing circuit, a selector configured to freely select at least one of the data outputted from the signal processing circuit, the data outputted from the image processing circuit, or the data stored in the storage section, and an interface configured to externally output data selected by the selector or a signal or externally receive input of data or a signal.

* * * * *